(12) United States Patent  
Nakata et al.

(10) Patent No.: US 7,008,829 B2  
(45) Date of Patent: Mar. 7, 2006

(54) ALIGNMENT MARKS AND MANUFACTURING METHOD FOR THE SAME

(75) Inventors: Shinichi Nakata, Tokyo (JP); Yuji Yamamoto, Tokyo (JP); Mamoru Okamoto, Tokyo (JP); Michiaki Sakamoto, Tokyo (JP); Hironori Kikkawa, Tokyo (JP); Muneo Maruyama, Tokyo (JP)

(73) Assignee: NEC LCD Technologies, Ltd., (JP)

( * ) Notice: Subject to any disclaimer, the term of this patent is extended or adjusted under 35 U.S.C. 154(b) by 8 days.

(21) Appl. No.: 10/828,562

(22) Filed: Apr. 21, 2004

(65) Prior Publication Data

US 2004/0195704 A1     Oct. 7, 2004

Related U.S. Application Data

(62) Division of application No. 09/626,181, filed on Jul. 27, 2000, now Pat. No. 6,787,930.

(30) Foreign Application Priority Data

Jul. 29, 1999    (JP) .................................. 11-215894

(51) Int. Cl.  
H01L 21/84    (2006.01)  
H01L 21/20    (2006.01)

(52) U.S. Cl. ..................... 438/149; 438/151; 438/401
(58) Field of Classification Search ............... 438/149, 438/401  
See application file for complete search history.

(56) References Cited

U.S. PATENT DOCUMENTS

| | | | | |
|---|---|---|---|---|
| 5,053,765 A | 10/1991 | Sonehara et al. | ...... | 340/815.43 |
| 5,058,997 A * | 10/1991 | Dickerson et al. | .......... | 349/105 |
| 5,320,920 A | 6/1994 | Isoda et al. | ..................... | 430/7 |
| 5,850,276 A | 12/1998 | Ochi et al. | ................... | 399/158 |
| 5,935,741 A | 8/1999 | Kim et al. | ...................... | 430/7 |
| 6,136,481 A | 10/2000 | Aoki | ............................. | 430/7 |
| 6,143,450 A | 11/2000 | Sobue et al. | ................. | 347/106 |
| 6,177,214 B1 * | 1/2001 | Yokoyama et al. | ............ | 430/7 |
| 6,340,547 B1 | 1/2002 | Chen et al. | ................... | 430/22 |
| 6,671,025 B1 * | 12/2003 | Ikeda et al. | ................. | 349/156 |
| 6,787,930 B1 * | 9/2004 | Nakata et al. | .............. | 257/797 |

FOREIGN PATENT DOCUMENTS

| | | |
|---|---|---|
| JP | 63-243915 | 10/1988 |
| JP | 01137238 | 5/1989 |
| JP | 02158120 | 6/1990 |
| JP | 06-094422 | 4/1994 |
| JP | 7-72473 | 3/1995 |
| JP | 07072473 | 3/1995 |
| JP | 08-029614 | 2/1996 |
| JP | 08-062597 | 3/1996 |
| JP | 08-076102 | 3/1996 |
| JP | 8-122824 | 5/1996 |
| JP | 08146371 | 6/1996 |
| JP | 08297206 A | 11/1996 |
| JP | 09043416 | 2/1997 |
| JP | 09-096712 | 4/1997 |
| JP | 09096712 A | 4/1997 |

(Continued)

*Primary Examiner*—Jennifer Kennedy  
(74) *Attorney, Agent, or Firm*—Hayes Soloway P.C.

(57) ABSTRACT

Alignment marks are formed when source and drain electrodes of a TFT are formed and thereon a thick red filter is formed. So that, the following respective color layers can be made thin on the red filter. Also, the exposure alignment laser permeates in an exposure step, and thereby the alignment marks can be accurately detected.

2 Claims, 30 Drawing Sheets

FOREIGN PATENT DOCUMENTS

| | | |
|---|---|---|
| JP | 09-189916 | 7/1997 |
| JP | 10-39292 | 2/1998 |
| JP | 63-026634 | 2/1998 |
| JP | 10-209202 | 8/1998 |

* cited by examiner

ALIGNMENT MARKS AND MANUFACTURING METHOD FOR THE SAME

CROSS REFERENCE TO RELATED APPLICATION

This application is a divisional of U.S. application Ser. No. 09/626,181, filed Jul. 27, 2000 now U.S. Pat. No. 6,787,930.

BACKGROUND OF THE INVENTION

1. Technical Field of the Invention

The present invention relates to an active matrix type liquid crystal display employing an inverted staggered type thin-film transistor (hereinafter referred to as "TFT") as an active element and having a color layer on a wafer side where the TFT is mounted, and, in particular, relates to alignment marks which serve as an alignment reference in each production step and a manufacturing method for the same.

2. Description of the Related Art

FIGS. 1A and 1B show a first embodiment of the prior art, that is, schematic views of a channel etch type TFT of an active matrix wafer in a liquid crystal display. FIG. 1A shows a plan view of one picture element, FIG. 1B shows a section of a region of the TFT along the cut line I—I of FIG. 1A, and FIGS. 2A and 2B show sections of a terminal portion. In FIG. 1B, a gate electrode 42a is formed on a transparent insulated wafer 41 and thereon, a gate insulating film 43 is formed to cover them. Further thereon, a semiconductor layer 44 is formed so as to overlap the gate electrode 42a, and a source electrode 46a and drain electrode 47 distant on the central part of the semiconductor layer is connected to the semiconductor layer 44 via an ohmic contact layer 45. The ohmic contact layer between the source electrode 46a and drain electrode 47 is removed by etching and the ohmic contact layer 45 is formed only between the source electrode 46a, the drain electrode 47 and semiconductor layer 44. Further, a passivation film 48 is formed so as to cover them. On the passivation film 48, a transparent conductive film to be a picture element electrode 49 is connected to the drain electrode 47 via a contact through hole 51 penetrating through the passivation film 48. A switching signal is inputted to the TFT through a gate wiring 42b and the source electrode 42a, and an image signal is inputted through a source wiring 46b and the source electrode 46a, whereby a picture element electrode 49 is charged.

Then, a manufacturing method for the active matrix wafer shown in FIGS. 1A, 1B, 2A and 2B is explained with reference to FIGS. 3A to 3C and 4A and 4B. Here, the TFT portion is shown on the left side of FIGS. 3A to 3C and an alignment portion, which is used for alignment with a mask in an exposure device in each photolithography step, is shown on the right side of FIGS. 3A to 3C. The alignment portion is provided, as shown in FIG. 5A, on the outside of a picture element display area 65 of the active matrix wafer. FIG. 5B is an enlarged plan view of the alignment portion and FIG. 5C is a section thereof.

As shown in FIG. 3A, on the transparent insulated wafer 41 made of glass, etc., a conductive layer made from Al, Mo, and Cr, etc. is deposited to be 100 to 400 nm in thickness by sputtering and a first patterning step is performed such that, through a photolithography step, gate wiring (not illustrated), gate electrodes 2a, and gate terminals (not illustrated) connected to an external signal processing wafer for display are formed. Here, gate alignment marks 63a used for overlapping with gate wiring and gate electrodes in the following step are formed outside the display area by the same layer. Then, as shown in FIG. 3B, a second patterning step is performed such that a gate insulating film 43 made of a silicon nitride film, etc. and a semiconductor layer 44 made of amorphous silicon, and an ohmic contact layer 45 made of n+ amorphous silicon are laminated to be approximately 400 nm, 300 nm, and 50 nm in thickness in sequence, respectively, and the semiconductor layer 44 and ohmic contact layer 45 are collectively patterned. Herein, for patterning, as shown in FIG. 3B, alignment between a mask 61 and an active matrix wafer 50c is necessary in the exposure device.

The alignment is performed, as shown in FIG. 3B, as follows; gate alignment marks 63a, formed in the first patterning step where the gate electrode 42a, etc. is formed, are used which are aligned with mask side alignment marks 62 formed on a mask 61. For aligning the alignment marks, as shown in FIG. 6A, respective alignment marks formed on the active matrix wafer 50c and mask 61 are read by means of a laser beam, whereby the mask side alignment marks 62 and the active matrix wafer side alignment marks 63 are aligned. At this time, for reading the alignment marks, as shown in FIG. 6B, an exposure alignment laser 66 is irradiated on alignment marks 60 through a transparent film 67 and a light reflected from alignment marks 60 or, as shown in FIG. 6C, a light diffracted from the step portion due to the alignment marks 60 are read. When reading is performed by means of the reflected light, it is necessary that the alignment marks are formed of a metal which reflects the laser beam and if the marks have a film thereon, its material does not absorb the reflected light. Also, when reading is performed by means of the diffracted light based on the step portion, the alignment marks have no restriction in material and if the marks have a film thereon, as shown in FIG. 6C, it may be a non-transparent film 68, and further, it is necessary that the step portion of the alignment marks are not flattened due to the film material and film thickness.

Then, a third patterning step is performed, as shown in FIG. 3c, in that Mo and Cr, etc. are deposited to be 100 to 200 nm in thickness so as to cover the gate insulating film 43 and ohmic contact layer 45 by sputtering and thereon, source electrodes 46a, source wiring 46b, drain electrodes 47, and lower electrodes 47d (FIG. 2B) of data terminals 47a connected to an external signal processing wafer for display are formed by a photolithography step, as shown in FIG. 4A. Here, in an exposure step, the mask 61 and active matrix wafer 50c are aligned, as shown in FIG. 3C, by means of the gate alignment marks 63a formed in the first patterning step. Further, as shown in FIG. 4A, drain layer alignment marks 63b are formed of a drain metal material at the same time in the third patterning step. After the third patterning step, the unnecessary ohmic contact layer 45 on the area other than under the source electrode 46a and drain electrode 47, which serves as a channel portion of the TFT, is removed.

Thereafter, a fourth patterning step is performed, as shown in FIG. 4A, in that, a passivation film 48 made of an inorganic film such as a silicon nitride film is formed to be 100 to 200 nm in thickness by the plasma CVD method so as to cover the back channel of the TFT, that is, the source electrode 46a, source wiring 46b, the drain electrode 47, and a lower electrode 47d of a data terminal 47a, a contact through hole 51 for making a contact with the drain electrode 47 and picture element electrode 49 is formed, and unnecessary gate insulating film 43 on the lower electrode 47d (FIG. 2B) of the data terminal 47a and unnecessary gate insulating film 43 and passivation film 48 on the lower electrode (FIG. 2A) of the gate terminal 42c are removed. Herein, alignment between the mask 61 and active matrix wafer 50c in an exposure step is performed, as shown in FIG. 4A, by means of the drain layer alignment marks 63b formed in the third patterning step.

Lastly, as shown in FIG. 4B, a fifth patterning step is performed such that a transparent conductive film 149 to be a picture element electrode is formed by sputtering. Herein, alignment between the mask 61 and active matrix wafer 50c in an exposure step is performed, as shown in FIG. 4B, by means of the drain layer alignment marks 63b formed in the third patterning step.

An active matrix wafer shown in FIG. 1B is produced by such a manufacturing method through five patterning steps, and therefore, the production process is significantly shortened. The active matrix wafer is used and combined with color filters and another wafer having electrodes, liquid crystal is sandwiched between two wafers, thereby composing a liquid crystal display.

However, in this active matrix wafer, when shown as a plan view of FIG. 1A, light leaks between the gate wiring 42b and source wiring 46b and picture element electrode 49, and therefore, it is necessary to be shaded by a black matrix provided on a color filter wafer. In this case, when lamination accuracy of the color filter wafer and active matrix wafer is taken into consideration, a large shaded area of the black matrix has to be secured, and therefore, there are problems in that the aperture ratio of the liquid crystal display is decreased and backlight is not effectively utilized.

With respect to the above problems, as a means for improving aperture ratio, a method, in which a color filter wafer is formed on an active matrix wafer (a CF on TFT structure), has been suggested, for example, in Japanese Laid-open Patent Publication No. 39292 of 1998, which is a second prior art. For producing such a structure, when conditions, etc. which have not described in the Publication are added, its actual manufacturing method is as follows.

As shown in FIG. 7B, on a passivation film 78, a dispersed pigment type photoresist black matrix is coated by spin coating and, by a photolithography step, a black matrix 85' is formed on the gate wiring including an area where a contact hole is to be formed and on a channel etch type TFT 10a. The spin speed of a spin coater is adjusted so that the film thickness becomes approximately 1.5 $\mu$m. Here, in an exposure step, alignment between a mask 91 and an active matrix wafer 80c is performed, as shown in FIG. 10B, by means of active matrix wafer side alignment marks 93 formed in a TFT formation step.

Then, as shown in FIG. 7c, on an active matrix wafer which has been cleaned by ultraviolet light, a dispersed pigment type photosensitive red color resist is coated to be approximately 1.2 $\mu$m in thickness by spin coating and a red filter 83a' is formed into a predetermined pattern by a photolithography step. Here, in an exposure step, alignment between a mask 91 and an active matrix wafer 80c is performed, as shown in FIG. 10C, by means of active matrix wafer side alignment marks 93 formed in a TFT formation step.

Then, as shown in FIG. 8A, for the purpose of forming a green filter, on an active matrix wafer which has been cleaned by ultraviolet light, a dispersed pigment type photosensitive green color resist is coated to be approximately 1.2 $\mu$m in thickness by spin coating and a green filter 83b' is formed into a predetermined pattern by a photolithography step. Here, in an exposure step, alignment between a mask 91 and an active matrix wafer 80c is performed, as shown in FIG. 11A, by means of active matrix wafer side alignment marks 93 formed in a TFT formation step.

Then, as shown in FIG. 8B, for the purpose of forming a blue filter, on an active matrix wafer which has been cleaned by ultraviolet light, a dispersed pigment type photosensitive blue color resist is coated to be approximately 1.2 $\mu$m in thickness by spin coating and a blue filter 83c is formed into a predetermined pattern by a photolithography step. Here, in an exposure step, alignment between a mask 91 and an active matrix wafer 80c is performed, as shown in FIG. 11B, by means of active matrix wafer side alignment marks 93 formed in a TFT formation step.

Then, as shown in FIG. 3c, on a TFT wafer on which the black matrix 85', red filter 83a', green filter 83b', and blue filter 83c' are formed, an overcoat layer 84 for flattening the TFT wafer is formed to be approximately 3 $\mu$m in thickness. A photosensitive acrylic resin is used and coated as the overcoat layer by spin coating, and then an aperture is provided for a contact through hole portion 81 on the overcoat layer. Since alignment between a mask and active matrix in an exposure step is performed in a similar manner to that of the foregoing steps, and it is likewise in the following steps, the description thereof will be omitted (not illustrated).

Then, as shown in FIG. 9A, after a novolac photoresist 87 is coated on the overcoat layer 84 which is then patterned, the black matrix at the contact through hole portion is removed by means of the novolac photoresist 87 as its mask by a dry etching.

Then, as shown in FIG. 9B, an aperture is provided on the passivation film 78 for the contact through hole by dry etching, and the complete aperture for the contact through hole is provided. Lastly, a transparent conductive film to be a picture element electrode is formed by sputtering and processed into a predetermined pattern by a photolithography step, a picture element electrode 79 and a drain electrode 77 are connected, and thereby an active matrix wafer comprising the color filters formed on the TFT can be formed.

However, according to the investigation into this method by the inventor of the present invention, for the purpose of increasing shading characteristics of a resin black matrix, when a resin black matrix material having a high OD (optical density) value, in detail, an OD value of 3 or more is used, or when the film thickness of the resin black matrix is made thick, in detail, 1.2 $\mu$m or more, a problem is produced in that alignment marks for an exposure step cannot be detected. This is because with a high OD value, an exposure alignment laser is absorbed by the resin black matrix and the reflected light from the alignment marks cannot be detected, and with a thick resin black matrix, a step due to the alignment marks are flattened and diffracted light of the exposure alignment laser cannot be detected. Also, for a green filter and blue filter, when the film thickness of the resin black matrix is made thick, in detail 1.2 $\mu$m or more, a problem is produced in that the exposure alignment laser is absorbed in the exposure step, whereby the alignment marks cannot be detected.

As a method for forming a color filter wafer on an active matrix wafer without being effected by the abovementioned problems, a method for forming a black matrix not by means of a resin black matrix but by a metal shading film is suggested in Japanese Laid-open Patent Publication No. 122824 of 1996, which is a third prior art. The third prior art is now described in detail with reference to FIGS. 12A to 12C and 13A to 13C.

As shown in FIG. 12A, a channel protection type TFT 10*b* is formed on a transparent insulated wafer 101, and thereon a passivation film 108 is covered.

Then, as shown in FIG. 12B, a contact through hole 111 for an electrical connection is provided on the passivation film 108. Thereon, a metal film having shading characteristics such as Mo, Cr, Ti, and Al, etc. are formed to the 50 to 1000 nm in thickness by sputtering, etc. and which is patterned into a predetermined shape so as to be a black matrix 115'. At this time, overlapping a black matrix 115 with base wiring is important and alignment between a mask 121 and active matrix wafer 110 for forming a black matrix 115' is performed as shown in FIG. 14B. In this case, since the black matrix 115 is made of a metal film, when alignment marks are read for alignment, they are recognized not by refracted light but by diffracted light based on the step of the alignment marks. For alignment marks, drain layer alignment marks 123*b* are used.

Then, as shown in FIG. 12C, a dispersed pigment type photosensitive red resist 113*a* is coated to be approximately 1.2 μm in thickness by spin coating and a red filter 113*a*' is formed into a predetermined pattern by a photolithography step. At this time, alignment between a mask 121 and active matrix wafer 110*c* for forming a red filter 113*a*' is performed as shown in FIG. 14C. For alignment marks, the drain layer alignment marks 123*b* are used. Since the red resist 113*a* hardly absorbs an exposure alignment laser (He—Ne) used for reading the alignment marks, the alignment marks can be read by means of a light reflected from the drain layer alignment marks 123*b* regardless of the film thickness of the red resist 113*a*.

Then, as shown in FIG. 13A, for the purpose of forming a green filter 113*b*', a dispersed pigment type photosensitive green resist 113*b* is coated to be approximately 1.2 μm in thickness by spin coating and the green filter 113*b*' is formed into a predetermined pattern by a photolithography step. At this time, alignment between a mask 121 and active matrix wafer 110*c* for forming a green filter 113*b*' is performed through the green resist 113*b* as shown in FIG. 15A. For alignment marks, the drain layer alignment marks 123*b* are used.

Then, as shown in FIG. 13B, for the purpose of forming a blue filter, a dispersed pigment type photosensitive blue resist 113*c* is coated to be approximately 1.2 μm in thickness by spin coating and a blue filter 113*c*' is formed into a predetermined pattern by a photolithography step. At this time, alignment between a mask 121 and active matrix wafer 110*c* for forming a blue resist is performed through the blue resist 113*c* as shown in FIG. 15B. For alignment marks, the drain layer alignment marks 123*b* are used.

Then, as shown in FIG. 13C, an overcoat layer 114 for flattening the TFT wafer is formed to be approximately 3 μm in thickness on a thin film transistor wafer on which a black matrix 115', a red filter 113*a*', a green filter 113*b*, and a blue filter 113*c*' are formed. For the overcoat layer, a photosensitive acrylic resin is used and after the photosensitive acrylic resin is coated by spin coating, an aperture is provided for a contact through hole portion 161 on the overcoat layer by a photolithography step. Lastly, a transparent conductive film to be a picture element electrode 109 is formed by sputtering, which is processed into a predetermined pattern by a photolithography step, and the picture element electrode 109 and drain electrode 107 is connected.

By the abovedescribed method, a liquid crystal display having an active matrix wafer in which color filters are formed on the TFT can be produced. However, by the method according to the third prior art, since a metal shading film is used for the black matrix, an indoor light made incident from the opposite wafer side is reflected by the metal shading film, and thus there is a problem in that preferable display characteristics cannot be provided. In addition, since the conductive film is formed on a TFT and wiring, there is a problem in that a capacitance combination occurs. Compared with these methods for forming color filters on a TFT layer by a photolithography step, as a fourth prior art, a method for forming color layer on a TFT by an electrodeposition method is suggested, for example, in Japanese Laid-open patent No. 72473 of 1995. Such manufacturing method using electro-deposition is described with reference to FIG. 16.

First, as shown in FIG. 16A, on a transparent insulated wafer 121, a polycrystal silicon film 153, a gate insulating film 123, a gate electrode 122*a*, an interlayer insulating film 151, source wiring 126*b*, and a base electrode 152, etc. are intensively formed by a semiconductor process. Then, an area other than the base electrode 152 is covered by a resist 137*a*. The area thus covered includes a drain side contact portion 141 of the TFT.

Then, as shown in FIG. 16B, the source wiring 126*b* corresponding to a green picture element is electrically selected and subjected to a electrodeposition treatment, and thereby a green filter 133*b*' made of a green electrodeposition film is formed in accordance with the base electrode 152. According to the electrodeposition treatment, an object to be coated is soaked in a container containing an electrodeposition solution colored in green, a direct current is supplied between the object and a counter electrode under appropriate conditions, and thereby forming a colored electrodeposition film on the object to be coated. The electrodeposition film once formed loses its conductivity when prebaking is performed. The electrodeposition solution is an aqueous solution or an aqueous dispersant of a high-polymer resin in which a coloring pigment is dispersed, and of which, for example, an anion type wherein polyester resin having a carboxyl group is neutralized by organic amine can be used. As for the coloring agent, organic pigments are used and are accurately dispersed, thereby securing the quality of the color filters.

Then, as shown in FIG. 16C, source wiring which corresponds to a red picture element is electrically selected and soaked in a red electrodeposition solution, thereby forming a red filter 133*a*'. Here, since the green electrodeposition film previously formed has lost conductivity due to prebaking, there is no fear of a red filter overlapping thereon. In a similar manner, a blue colored electrodeposition film is also formed on a corresponding picture element area. At the stage where all three primary color filters of red, green, and blue (R, G, and B) have been formed, a main firing is performed.

Then, as shown in FIG. 17A, a used-up resist 137*a* is peeled and a drain side contact portion 141 of the base electrode 152 is exposed and aligned with each color filter, whereby a picture element electrode 129 is formed by patterning. The picture element electrode 129 is electrically connected to a drain electrode 127 of the TFT via the drain side contact portion 141.

Then, as shown in FIG. 17B, a black matrix 135' is partially formed by means of the RGB color filters as its shading film by a back exposure method. The back exposure method utilizes the RGB color filters as a shading film from ultraviolet light and the black matrix 135' is provided on a main wafer in alignment with a gap portion between the RGB color filters. However, the black matrix is not provided on source wiring 126*b* with shading characteristics.

Lastly, as shown in FIG. 17C, in order to flatten the main wafer, all source wiring in the selected condition are soaked in a black electrodeposition solution and another black matrix 155' is deposited on the source wiring 126b.

According to the aforementioned method, a liquid crystal display having an active matrix wafer in which color filters are formed on a TFT by an electrodeposition method can be produced. However, when the color filters are formed on the TFT by the electrodeposition method, routed wiring for supplying the source wiring with a current is necessary, and thus there are problems in that freedom of design is. substantially limited and, therefore, the method is not suitable for production of a highly precise TFT.

The problems in the manufacturing method for an active matrix wafer according to the prior art, which has been described above, are summarized as follows.

First, according to the first prior art, when lamination accuracy of the color filter wafer and active matrix wafer is taken into consideration, a large shading area of the black matrix has to be secured, and therefore, there are problems in that the aperture ratio of the liquid crystal display is decreased and backlight is not effectively utilized.

Then, according to the second prior art, when a resin black matrix material having a OD of 3 or more is used or when the film thickness of the resin black matrix is made thick, a problem is produced in that alignment marks for an exposure step cannot be detected. This is because with a high OD value, an exposure alignment laser is absorbed by the resin black matrix and the light reflected from the alignment marks cannot be detected, and with a thick resin black matrix, a step of the alignment marks are flattened and a diffracted light of the exposure alignment laser cannot be detected. Also, for a green filter and blue filter, when the film thickness of the resin black matrix is made thick, a problems is produced in that the exposure alignment laser is absorbed in the exposure step, whereby the alignment marks cannot be detected.

Then, according to the third prior art, since a metal shading film is used for the black matrix, an indoor light made incident from the opposite wafer side is reflected by the metal shading film, and thus there is a problem in that preferable display characteristics cannot be provided. In addition, since the conductive film is formed on a TFT and wiring, there is a problem in that a capacitance combination occurs.

Lastly, according to the fourth prior art, when the color filters are formed on the TFT by the electrodeposition method therein described, routed wiring for supplying the source wiring with a current is necessary, and thus there are problems in that freedom of design is substantially limited and, therefore, the method is not suitable for production of a highly precise TFT.

SUMMARY OF THE INVENTION

The object of the present invention is to provide alignment marks, which allow formation of color layer patterns with excellent alignment accuracy, improve aperture ratio, and improve yields by utilizing materials used in production steps when a color layer is formed on an active matrix wafer side on which a thin film transistor is mounted, and a manufacturing method for an active matrix wafer using the same.

Alignment marks according to a first aspect of the present invention, comprises: a wafer, first alignment marks formed over the wafer, and second alignment marks covering the first alignment marks. The second alignment marks allow an alignment beam to permeate and the first alignment marks refract the alignment beam, thereby serving as an alignment reference for the following step.

The alignment beam may be a laser beam, the second alignment marks may be formed of a red filter, and the second alignment marks may be formed to be 1 μm or more in thickness.

Alignment marks according to a second aspect of the present invention, comprise: a wafer, first alignment marks formed over the wafer, and third alignment marks provided in the vicinity of the first alignment marks. The third alignment marks are formed based on the first alignment marks as a reference, and an alignment beam is diffracted at a step portion formed by the third alignment marks, whereby the third alignment marks serve as a alignment reference for the following step.

The alignment beam may be a laser beam, the third alignment marks may be formed of a red filter, and the third alignment marks may be formed to be 1 μm or more in thickness. Further, the first alignment marks are made of the same materials as source and drain electrodes of a thin-film transistor and provided on the same base film as that of the source and drain electrodes.

Alignment marks according to a third construction of the present invention comprise: a wafer, fourth alignment marks formed over the wafer, and a fifth alignment marks provided on the fourth alignment marks. The total thickness of the fourth alignment marks and the fifth alignment marks is formed to be 0.5 μm or more in thickness.

The fourth alignment marks may be composed of a semiconductor layer which is made of the same materials as a semiconductor layer of a thin-film transistor and provided on the same base film as that of the semiconductor layer, and the fifth alignment marks are made of the same materials as the source and drain electrodes of the thin-film transistor.

A first manufacturing method for alignment marks according to the present invention comprises the steps of: forming a thin-film transistor including at least a gate electrode, a gate insulating film, a semiconductor thin film, source and drain electrodes on a wafer; forming alignment reference marks by using the same material as at least one material of the gate electrode, the semiconductor film, and the source and drain electrodes in an area other than an area for forming the thin-film transistor at the same time when the gate electrode, the semiconductor film, and the source and drain electrodes are formed; forming a red filter alignment reference marks comprising a red filter covering the alignment reference marks; and then, performing an alignment of the following step pattern.

The alignment reference marks may be formed at the same time when source and drain electrodes with shading properties are formed, and alignment may be performed by light reflection caused by the alignment reference marks.

A second manufacturing method for alignment marks according to the present invention comprises the steps of: forming a thin-film transistor including at least a gate electrode, a gate insulating film, a semiconductor thin film, source and drain electrodes on a wafer; forming alignment reference marks by using the same material as at least one material of the gate electrode in the area other than an area for forming the thin-film transistor, the semiconductor film, and the source and drain electrodes at the same time when the gate electrode, the semiconductor film, and the source and drain electrodes are formed; forming a red filter alignment reference marks comprising a red filter in the area other than the thin-film transistor formation area and is distant from the alignment reference mark with the alignment reference marks as a reference; and then, performing an alignment of the following step pattern with the red filter alignment reference marks as a reference.

Alignment may be performed by diffracted light at a step portion formed by the red filter alignment reference mark.

A third manufacturing method for alignment marks according to the present invention comprises the steps of; forming a thin-film transistor including at least a gate electrode, a gate insulating film, a semiconductor thin film, source and drain electrodes on a wafer; forming alignment reference marks having a laminated structure comprising the semiconductor film and the source and drain electrodes by using the same material as those of the gate electrode, the semiconductor film, and the source and drain electrodes composing the thin film transistor in the area other than an area for forming the thin-film transistor; and then, performing alignment of the following step with the laminated structure alignment reference marks as a reference.

The semiconductor film may comprise an active semiconductor film as its lower layer and an ohmic semiconductor film as its upper,layer, and alignment is performed by diffracted light at a step portion formed by the laminated structure alignment reference mark.

(1) First embodiment of the present invention

According to a first embodiment of the present invention, an active matrix wafer in which color filters are formed on a TFT wafer by using color resists and a resin black matrix. A red filter formation is first performed when the color filters and resin black matrix are formed in order and the red filter is left on alignment marks provided on the active matrix wafer as an isolated pattern so as to cover the alignment marks.

(2) Second embodiment of the invention

According to a second embodiment of the present invention, an active matrix wafer in which color filters are formed on a TFT wafer by means of color resists and a resin black matrix. A red filter formation is first performed when the color filters and resin black matrix are formed in order and alignment marks are formed by a red filter layer when a red filter is formed.

(3) Third embodiment of the invention

According to a third embodiment of the present invention, an active matrix wafer in which color filters are formed on a TFT wafer by means of color resists and a resin black matrix. Unevenness s provided under the alignment marks used in the exposure step to form the color filters and resin black matrix.

As has been described before, according to alignment marks and a manufacturing method therefore of the present invention, in production steps of an active matrix wafer having a color layer on its TFT side, accurate alignment can be carried out by making use of light permeability and a step of a red filter of the color layer, and therefore, reduced alignment margin and improved aperture ratio can be realized. In addition, instead of using the red filter, a step of a semiconductor layer composing the TFT may also be utilized, and thereby a similar effect can be obtained.

BRIEF DESCRIPTION OF THE DRAWINGS

The foregoing and other features and advantages of the present invention will become more readily more appreciated as the same becomes better understood by reference to the following detailed description when taken into conjunction with the accompanying drawings wherein.

DETAILED DESCRIPTION OF THE PREFERRED EMBODIMENTS

A first embodiment of the present invention will be described through reference to an example where a TFT is used as a switching element for a liquid crystal display.

Figure 18:
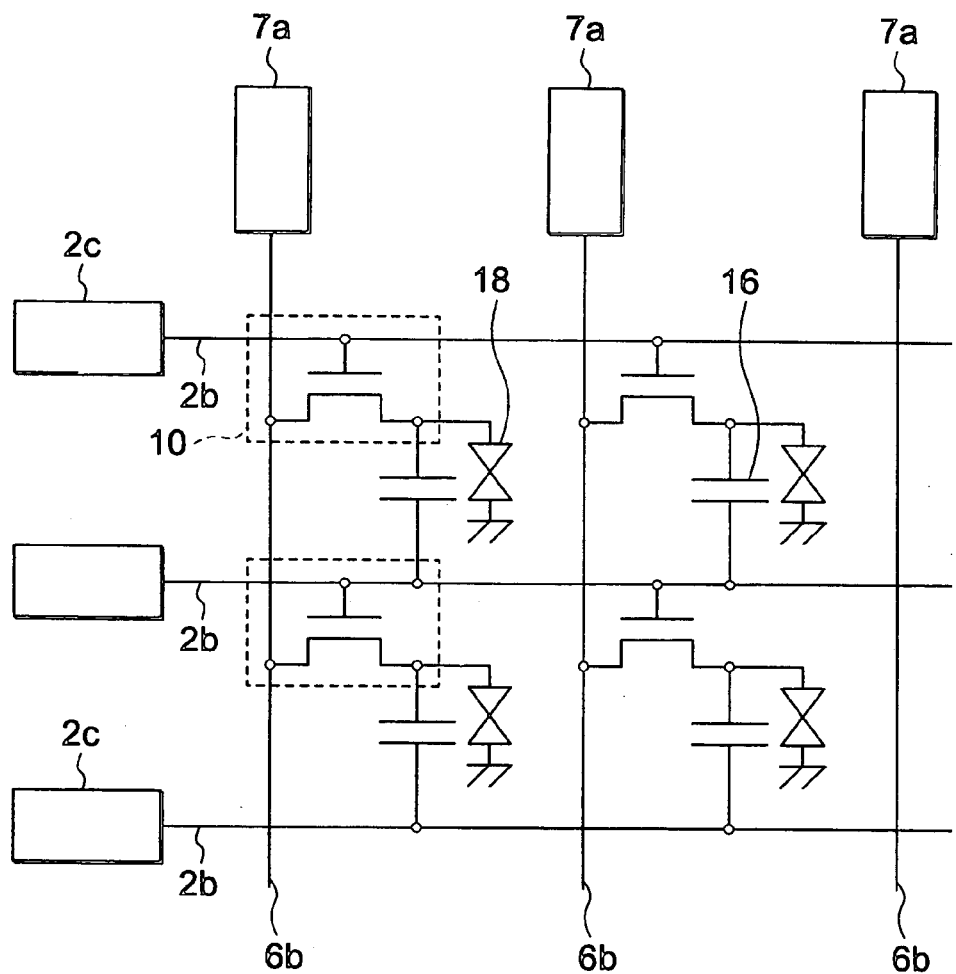
FIG. 18 is a circuit diagram showing a general composition of an active matrix wafer in a liquid crystal display.

FIG. 18 is a circuit diagram showing a configuration of an active matrix wafer in a liquid crystal display. Gate wiring 2b and source wiring 6b are arranged so as to be perpendicular to each other on a transparent insulated wafer, and TFTs 10 and picture element capacitance 16 are formed so as to correspond the intersections of these signal wires. The gate wiring 2b is connected to gate electrodes of the TFTs 10 and the TFT 10 corresponding to a picture element selected by a scanning signal inputted to the gate electrode from the gate wiring 2b is driven. The source wiring 6b is connected to the source electrodes of the TFTs 10 and inputs data signals to the source electrodes. Picture element electrodes are connected to drain electrodes of the TFTs 10. Each picture element electrode overlaps the adjacent gate wiring 2b via a gate insulating film and serves as an additional capacitance electrode.

Figure 19A:
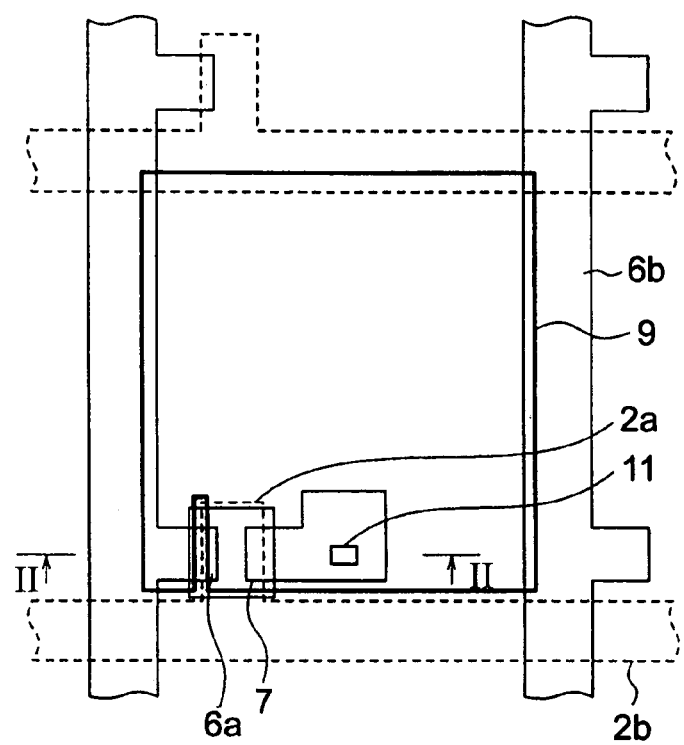
FIGS. 19A and 19B are plan views showing a general composition of a picture element portion in separate manners showing wiring and color layers in main, respectively.
Figure 19B:
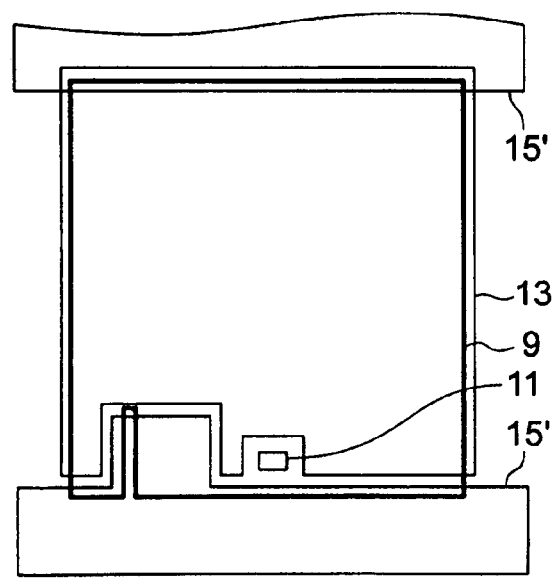

FIGS. 19A and 19B show a composite picture separately for the prevention of unclear relationships due to overlapping, wherein a plan view of the electrodes and wiring, etc. is shown as FIG. 19A while a plan view showing the positional relationship between only the picture element, color filter, black matrixes, and contact through hole is shown as FIG. 19B. Under each picture element electrode 9, a corresponding color filter 13 is formed with an overcoat layer therebetween. On a passivation film on a gate wiring 2b, a black matrix 15' is formed and which also serves to shade a TFT. The black matrix is not formed at the periphery of a contact through hole 11. The picture element electrode 9 is connected to the drain electrode 7 via an aperture portion of an overcoat layer 14. Under the black matrix 15' and color filter 13, a plurality of gate wiring 2b and a plurality of source wiring 6b are provided so as to be perpendicular to each other and at the intersections of the gate wiring 2a and source wiring 6b, TFTs are provided. As regards the TFTs, to gate electrodes 2a, the gate wiring 2b is connected, to source electrode 6a, the source wiring 6b is connected, and to the drain electrode 7, the picture element electrode 9 is connected via the contact through hole 11 which goes through the overcoat layer 14 and passivation film 8. To the TFT, a switching signal is inputted through the gate wiring 2b and gate electrode 2a, and an image signal is inputted through the source wiring 6b and source electrode 6a, and whereby the picture element electrode 9 is charged. 6b are provided so as to be perpendicular to each other and at the intersections of the gate wiring 2a and source wiring 6b, TFTs are provided. As regards the TFTs, to gate electrodes 2a, the gate wiring 2b is connected, to source electrode 6a, the source wiring 6b is connected, and to the drain electrode 7, the picture element electrode 9 is connected via the contact through hole 11 which goes through the overcoat layer 14 and passivation film 8. To the TFT, a switching signal is inputted through the gate wiring 2b and gate electrode 2a, and an image signal is inputted through the source wiring 6b and source electrode 6a, and whereby the picture element electrode 9 is charged.

Figure 20A:
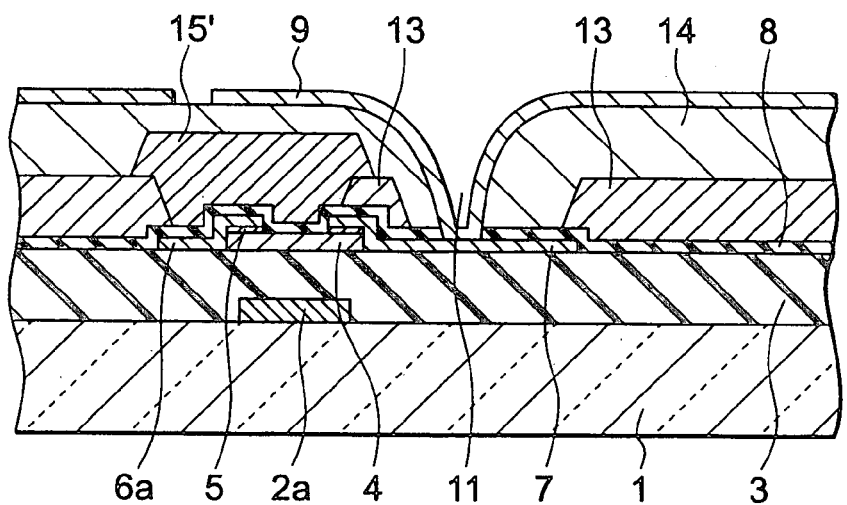
FIGS. 20A and 20B are sections showing a first embodiment of the present invention.

FIG. 20A is a section showing the wafer cut along the cut line II—II shown in the plan view of FIG. 19A. The gate electrode 2a is provided on the transparent wafer 1 and the gate insulating film 3 is formed so as to cover them. Thereon, a semiconductor layer 4 is formed so as to overlap the gate electrode 2a and the source electrode 6a and drain electrode 7, which are distant on the central part of the semiconductor layer 4, are connected to the semiconductor layer 4 via an ohmic contact layer 5, respectively. The ohmic contact layer between the source electrode 6a and drain electrode 7 is removed by etching, and the ohmic contact layer 5 is provided only between the source electrode 6a, drain electrode 7, and semiconductor layer 4. Further thereon including the channel portion where the ohmic contact layer 5 is removed by etching, the passivation film is provided so as to cover them. Such a TFT is generally known as a channel etch type TFT. In such a case where the TFT is used as a switching element, the drain electrode 7 serves as a drawing-out electrode to be connected to the picture element electrode 9, and the drain electrode 7 and picture element electrode 9 are connected through the contact through hole 11 provided through the overcoat layer 14 and passivation film 8. On the passivation film 8, color filters 13 comprising color layers of R, G and B, respectively, are provided at a part corresponding to the picture element display area, however, the color filters 13 are not formed at the periphery of the contact through hole 11 and the color filters 13 are provided with an aperture in an area including the contact through hole 11. Moreover, the aperture is provided in the color filter layer in FIG. 19B and FIG. 20A, however, the aperture may be provided in the black matrix layer or the aperture may be provided so that one side thereof are the color filters and the other side is the black matrix as shown in section.

Figure 20B:
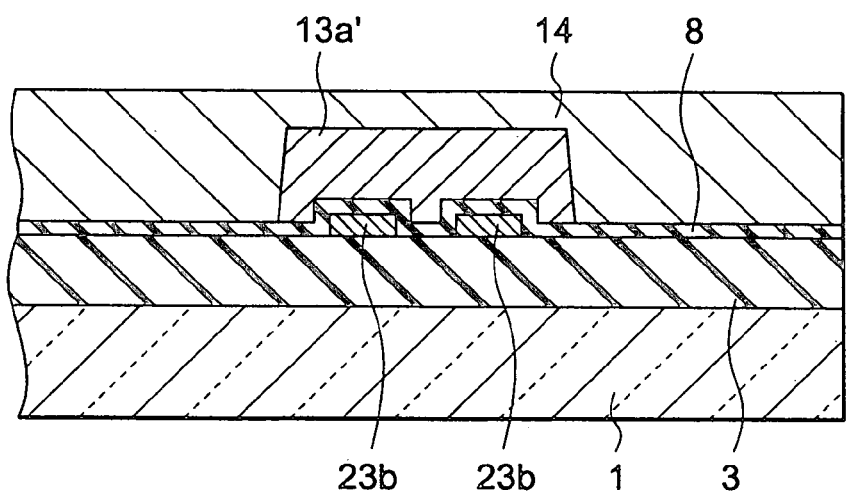

Furthermore, FIG. 20B is a section showing the exposure alignment mark portion provided on the outside of the picture element display area composed in the FIG. 20A, wherein the features of the present invention are most clearly shown. The gate insulating film 3 is formed on the transparent insulated wafer 1. Thereon, drain layer alignment marks 23b formed of a drain metal layer are provided and in the area covering the drain layer alignment marks 23b, a red filter 13a is provided in an isolated manner. Further, thereon, an overcoat layer 14 is formed so as to cover them, however, the overcoat layer 14 may be removed by patterning. In the present embodiment, the drain layer alignment marks 23b formed of the drain metal layer are used, however, gate layer alignment marks formed of a gate metal layer may also be used.

In the present invention, a liquid crystal display such that a picture element electrode is connected to a switching element through color filters or a black matrix layer can be applied, and for the switching element, an MIM and diode, etc. may be employed and so is not only limited to a TFT, and in the case using a TFT, it need not only be an inverted staggered type but a regular staggered type may be employed.

Furthermore, as regards a liquid crystal display according to the present invention, there are no particular limitations on-constructions other than the above, and for example, materials for a liquid crystal, an orientation film, opposed films, and opposed electrodes may be composed as in the general use of an active matrix type liquid crystal display. Also, the various color filters comprise three colors of red (R), green (G), and blue (B) which are generally used to display in full color, however, the colors can be appropriately changed.

Then, a manufacturing method according to the first embodiment of the present invention is described, wherein sections of the area corresponding to the FIGS. 20A and 20B are described based on the production flow from a passivation film 8 formation stage onwards. The description is made with reference to process views referring to the sections of FIGS. 21A to 21C, FIGS. 22A to 22C, and FIGS. 23A to 23C showing a manufacturing method,of a picture element display area and an exposure alignment mark portion.

Figure 21A:
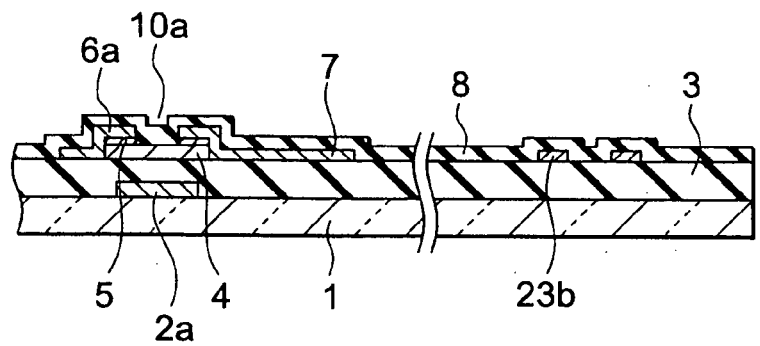
FIGS. 21A to 21C are sections showing a manufacturing method of a first embodiment of the invention in the order of the manufacturing steps.

As shown in FIG. 21A, a channel etch type TFT 10a is formed on a transparent insulated wafer 1 made of, for example, glass. Similarly to the prior art, the forming method can be performed in the following manner. On the transparent insulated wafer 1, a conductive layer made from Al, Mo, and Cr, etc. is deposited to be 100 to 400 nm in thickness by sputtering and by a photolithography step, a gate wiring (not illustrated), a gate electrode 2a, and gate terminal (not illustrated) connected to an external signal processing wafer for display are formed. Then, a gate insulating film 3 made of a silicon nitride film, a semiconductor layer 4 made of amorphous silicon, and ohmic contact layer 5 made of n+ amorphous silicon are laminated to be approximately 400 nm, 300 nm, and 50 nm in thickness in sequence in that order, respectively, and the semiconductor layer 4 and ohmic contact layer 5 are collectively patterned. Then, Mo and Cr, etc. are deposited to be 100 to 200 nm in thickness so as to cover the gate insulating film 3 and ohmic contact layer 5 by sputtering, thereon a source electrode 6a, source wiring (not illustrated), a drain electrode 7, and a data terminal (not illustrated) connected to the external signal processing wafer for display are formed by a photolithography step, and the ohmic contact layer 5 on unnecessary areas other than the area under the drain electrode 7 is removed. Then, a passivation film 8 made of an inorganic film such as a silicon nitride film is formed to be 100 to 200 nm in thickness by the plasma CVD method so as to cover the back channel of the TFT, that is, the source electrode 6a, source wiring (not illustrated), the drain electrode 7, and a data terminal (not illustrated).

Figure 21B:
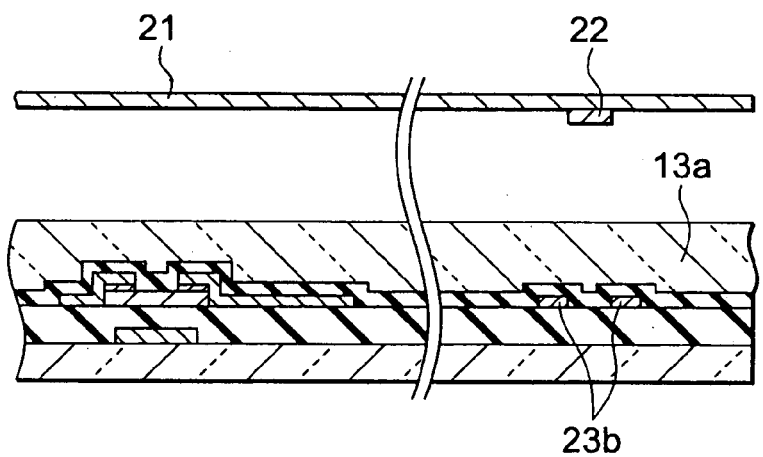
Figure 21C:
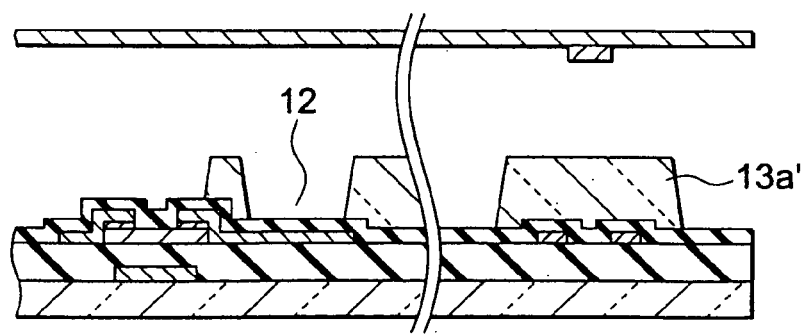

Then, as shown in FIG. 21B, a negative photo-curing color resist, in which a red pigment is dispersed in an acrylic resin, is coated onto the wafer by spin coating. The spin speed is adjusted so that the film thickness becomes approximately 1.2 $\mu$m. Then, prebaking is performed at 80° C. for two minutes on a hot plate, and after exposure, development is performed with a TMAH (tetramethyl ammonium hydroxide) solution, and a red filter 13a' is formed on a corresponding part (FIG. 21C). At this time, the red filter is not provided on the area where a contact through hole for connecting the drain electrode 7 and picture element electrode 9 is to be formed in the following step, but an aperture 12 is formed instead. The aperture size is large enough to contain at least the contact through hole. Then, firing is performed at 220° C. for 60 minutes in a clean oven and the red filter 13a' is cured. In the exposure step for forming this red filter 13a', as shown in FIG. 21B, an alignment mark portion for exposure provided in the vicinity of a picture element area is covered by the red filter 13a, and for mask alignment at the time of exposure, it is necessary to read the drain layer alignment marks 23b through the red filter 3a. Since the red filter 13a is 1 $\mu$m or more in film thickness, unevenness due to the alignment marks is flattened, thus it is impossible to read the alignment marks based on the step. However, since the red filter 13a allows a laser beam (He—Ne, 633 nm in wavelength), which is used to read the alignment marks, to permeate adequately, even though the film thickness of the red filter 13a is 1 $\mu$m or more, the underlying drain layer alignment marks 23b can be detected. By this patterning step, as shown in FIG. 21C, an isolated red filter 13a' is formed on the drain layer alignment marks 23b. It is necessary to form the isolated red filter 13a' of a necessary minimum size so as to cover the drain layer alignment marks 23b.

Figure 22A:
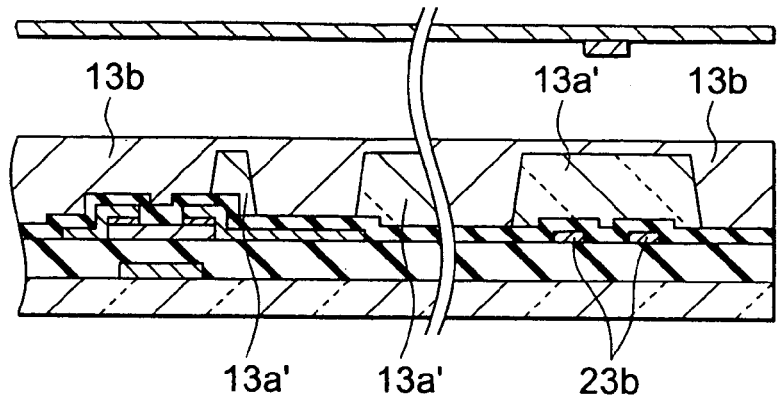
FIGS. 22A to 22C are sections subsequent to FIG. 21C.
Figure 22B:
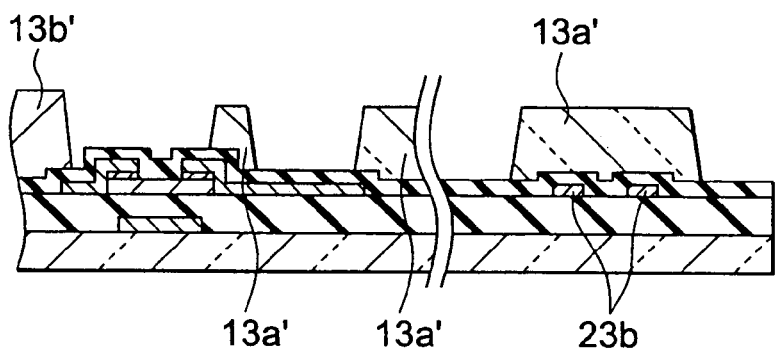
Figure 22C:
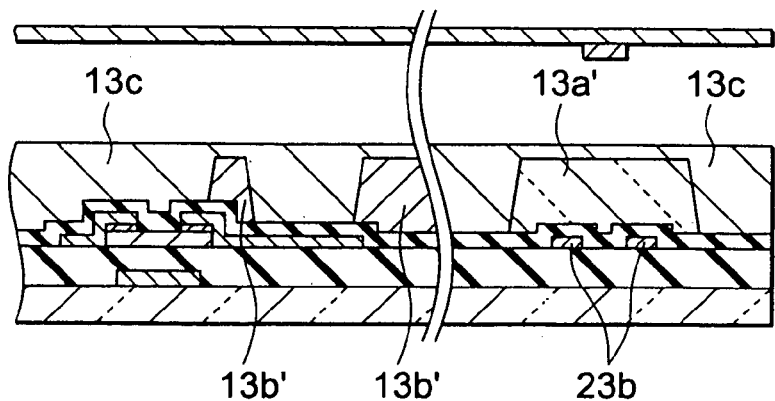

Then, as shown in FIG. 22A, a green filter 13b is formed in a manner similar to that for the red filter 13a' formation, firing is performed at 220° C. for 60 minutes in an oven, and thus the green filter 13b' is obtained (FIG. 22B). In the exposure step for forming this green filter 13b', as shown in FIG. 22C, the green filter 13b covers the isolated red filter 13a' formed on drain layer alignment marks 23b, and thereby the drain layer alignment marks 23b including the isolated red filter 13a' is flattened. In order to flatten the drain layer alignment marks 23b including the isolated red filter 13a', as described before, it is necessary for the isolated red filter 13a' to have a necessary minimum size that is within 5 by 5 mm square or within a 5 mm diameter circle. Owing to this flattening of the drain layer alignment marks 23b including the isolated red filter 13a' by means of the green filter 13b, the green filter 13b having a thickness of 1 $\mu$m or more is formed to be only 1 $\mu$m or less on the isolated red filter 13a', absorption of an exposure alignment laser can be reduced, and thus the reflected light of the exposure alignment laser from the drain layer alignment marks 23b can be read.

Figure 23A:
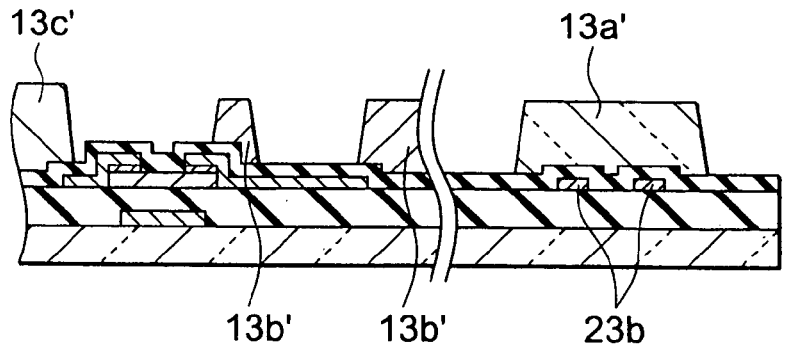
FIGS. 23A to 23C are sections subsequent to FIG. 22C.

As shown in FIGS. 22C and 23A, a blue filter 13c' can also be formed in a similar manner. Also, the exposure step for forming the blue filter 13c' is performed, as shown in FIG. 22C, by a method similar to that for the green filter 13b'. Moreover, as shown in FIG. 22C, neighboring alignment marks can also be read by a method similar to that for the green filter.

Figure 23B:
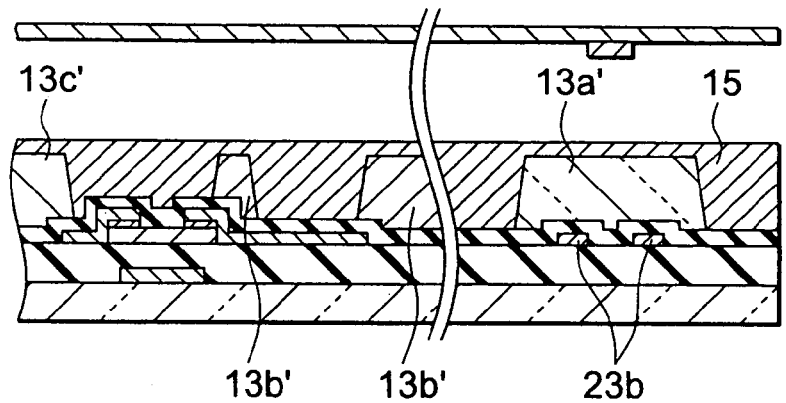
Figure 23C:
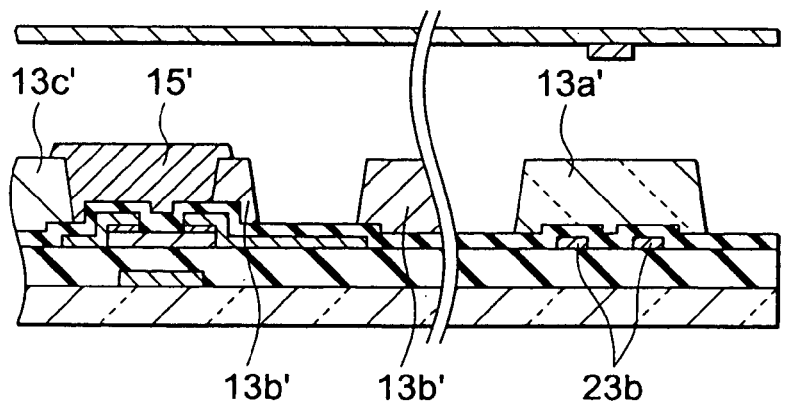

Then, as shown in FIGS. 23B and 23C, after the color filters are formed, a black matrix 15' is formed. For the black matrix 15', a photoresistive resin black matrix, in which carbon or a pigment is dispersed in an acrylic resin, is used. In the present embodiment, a material having a viscosity of about 20 cp is used and formed to be approximately 1.5 $\mu$m in film thickness on the abovementioned wafer by spin coating method, however, it is not provided on the contact through hole. Also, the exposure step for forming the black matrix 15' is performed, as shown in FIG. 23B, by a similar method to that for the green filter 13b' and blue filter 13c' formation. According to the present invention, the exposure alignment marks can be detected readily regardless of an OD value or a film thickness of the color filters.

Figure 24A:
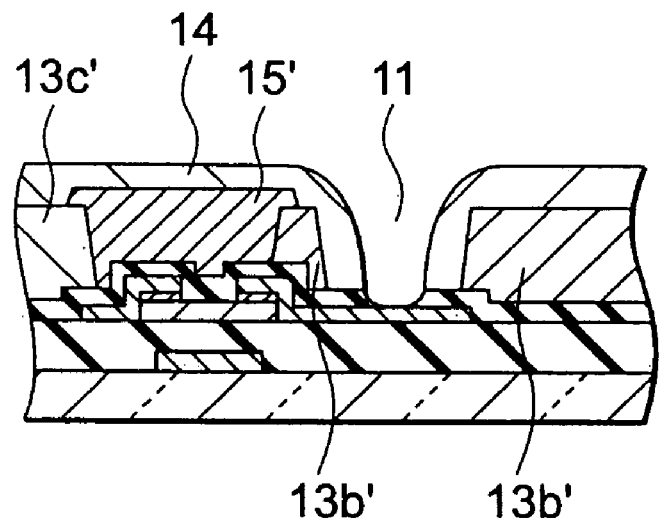
FIGS. 24A and 24B are sections subsequent to FIG. 23C.

Then, as shown in FIG. 24A, for flattening, for example, an acrylic transparent photo-resistive resin is coated, and exposed and developed, and thus formed into a pattern form having an aperture at the part of the contact through hole, and further, it is fired at 220° C. for 60 minutes and hardened, and thereby an overcoat layer 14 is formed.

Thereafter, a novolac photoresist is coated and patterned, a passivation film 8 is then etched by means of the novolac photoresist as a mask, and a contact through hole 11 is formed. At the same time, the unnecessary passivation film 8 on a data terminal portion (not illustrated) and unnecessary passivation film and gate insulating film on a gate terminal portion (not illustrated) are also removed.

Figure 24B:
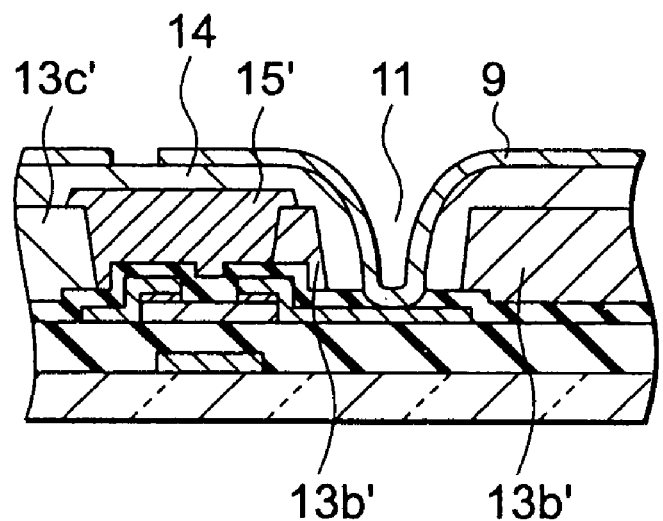

Lastly, as shown in FIG. 24B, after the novolac photoresist is peeled, on the drain electrode exposed from the overcoat layer 14 and contact thorough hole 11, a transparent conductive film such as an ITO is formed by sputtering and patterned, and a picture element electrode 9 is formed. At this time, the thicker the film thickness is, the more preferable coverage can be obtained, whereby electrical connection to the drain electrode 7 is stabilized, however, when workability on the ITO (Indium-Tin-Oxide) film used for the transparent conductive electrode is taken into consideration, the appropriate film thickness is approximately 100 nm.

Therewith, an opposed wafer is overlapped in accordance with an ordinal method, liquid crystal is poured, and thereby a liquid crystal display is completed.

In the foregoing description, though the thickness of the various color filters and the thickness of the black matrix vary depending on the materials used, when materials in general use are used, the various color filters have a thickness of about 1.0 to 2.5 $\mu$m when coated while the black matrix has a thickness of about 1.0 to 2.5 $\mu$m when coated. Also, it is preferable for the overcoat layer to be thick enough to flatten the surface, that is, in general, about 2.0 to 4.5 $\mu$m when coated.

According to a first effect of the first embodiment, since the alignment marks of the color layer and black matrix are accurately read, pattern shifts can be prevented and a decline in the service ability ratio due to alignment mark detection errors of an exposure device can be prevented. The effect can be achieved by forming the red filter first when the color layer and resin black matrix are formed, and forming an isolated pattern for covering the alignment marks by means of the red filter layer.

According to a second effect, since reading of the exposure alignment marks can correspond to higher OD of the black matrix or higher contrast in chromaticity, a liquid crystal display having a large chromaticity area and high contrast can thereby be produced.

Figure 25:
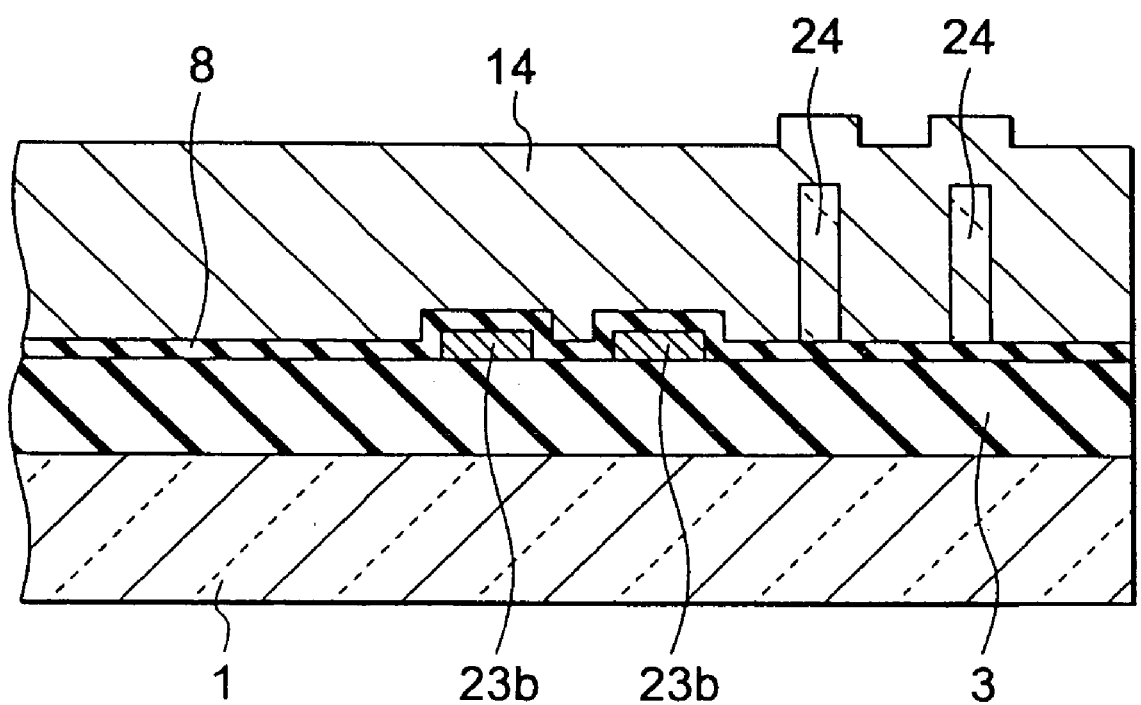
FIG. 25 is a section showing a second embodiment of the present invention.

Now, a second embodiment of the present invention is explained with reference to a section showing an exposure alignment mark portion of FIG. 25 and step views of FIGS. 26A to 26C and FIGS. 27A and 27B.

Figure 1A:
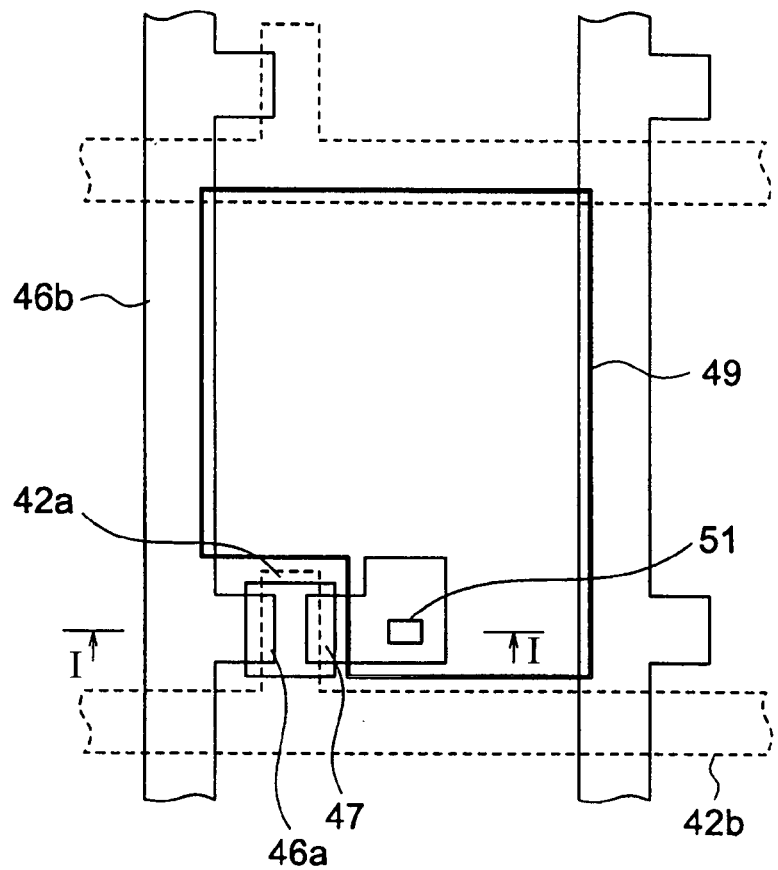
FIG. 1A is a plan view showing a construction of a picture element portion and FIG. 1B is a section thereof for explaining an active matrix wafer in the conventional liquid crystal display.
Figure 1B:
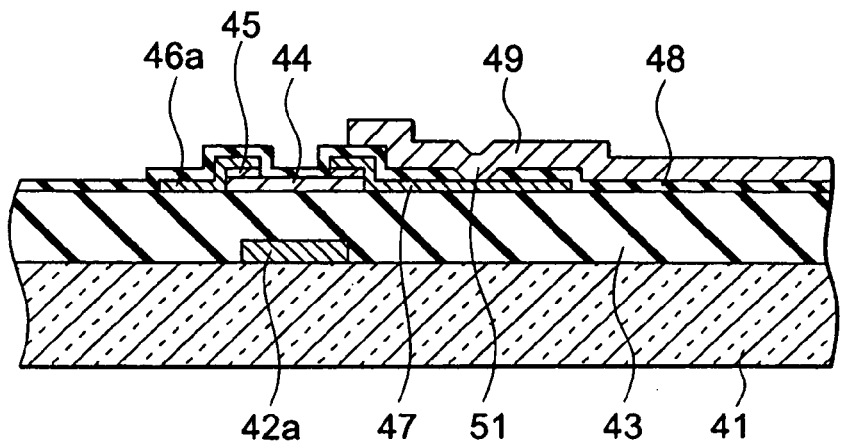
Figure 2A:
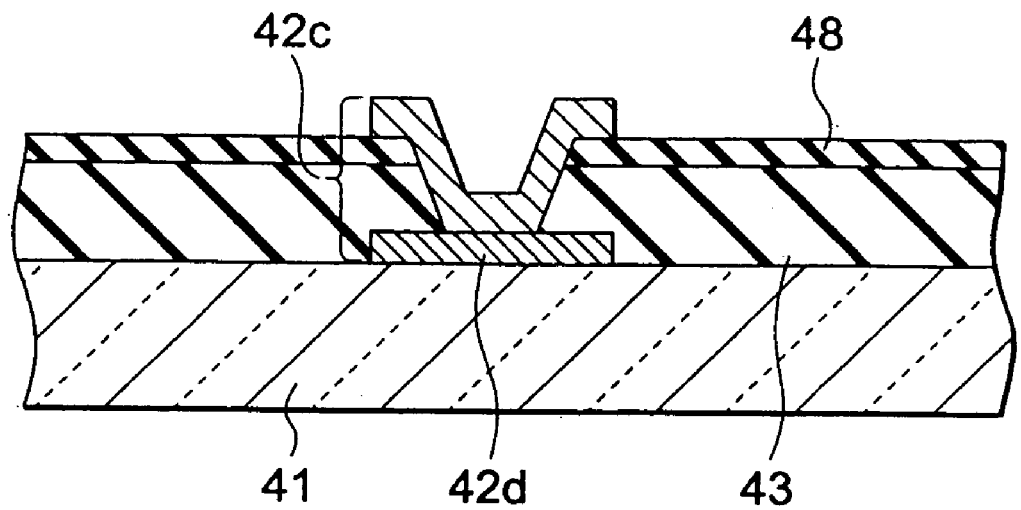
FIGS. 2A and 2B are sections showing a terminal portion according to a first prior art of the active matrix wafer.
Figure 2B:
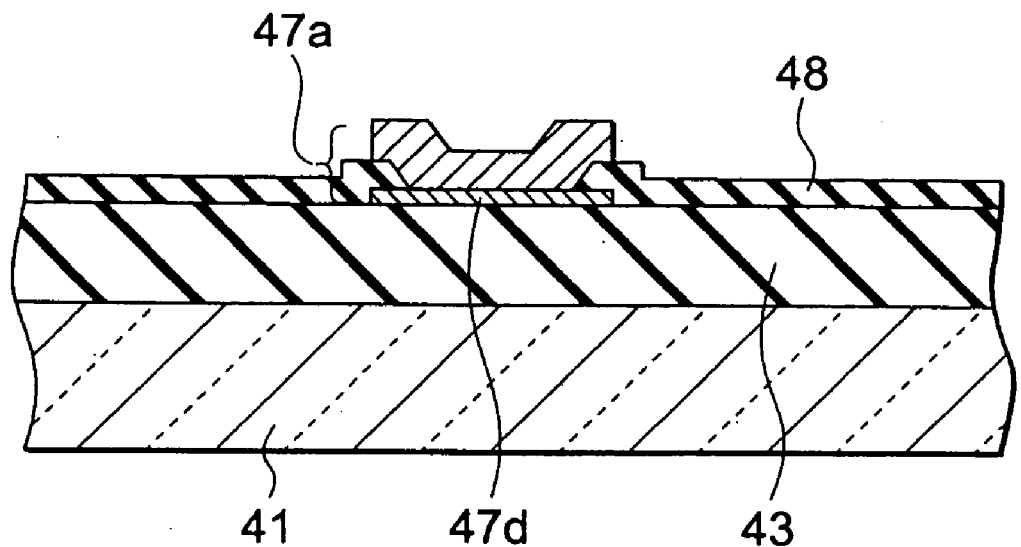
Figure 3A:
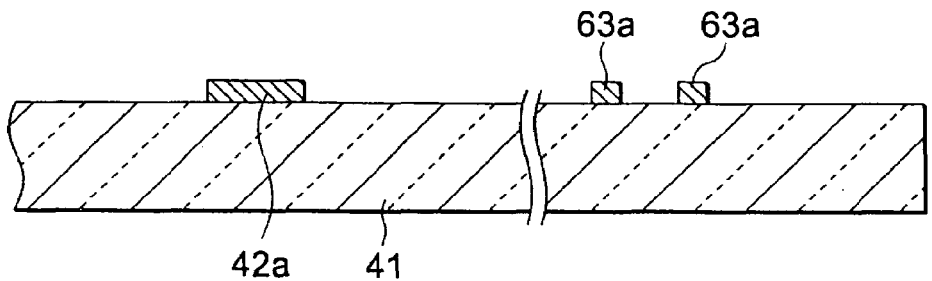
FIGS. 3A to 3C are sections showing a manufacturing method of a first prior art of the active matrix wafer in the order of the production steps.
Figure 3B:
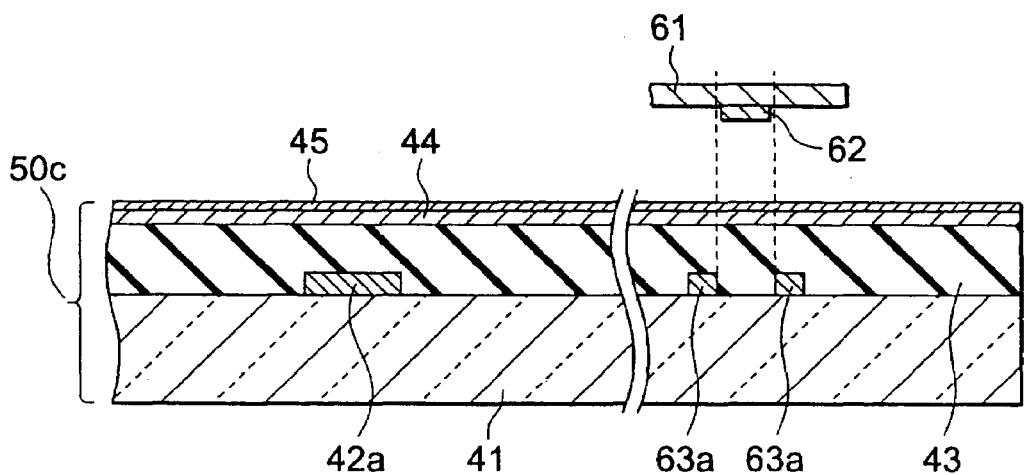
Figure 3C:
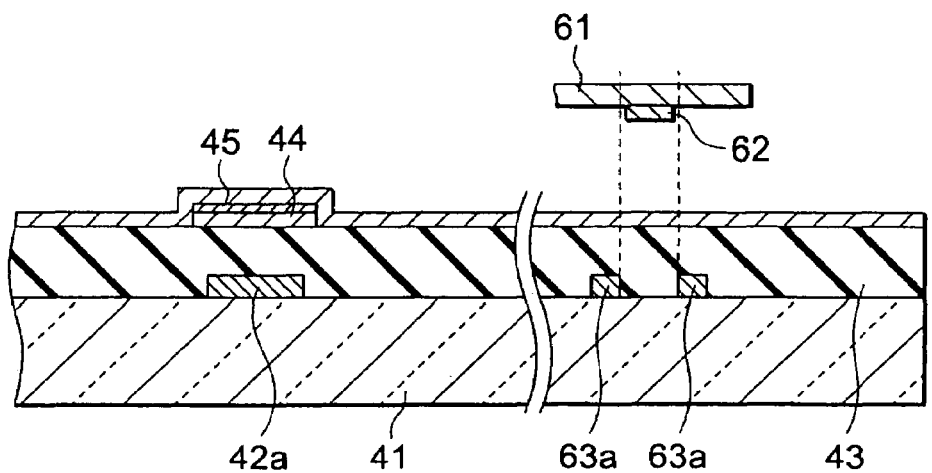
Figure 4A:
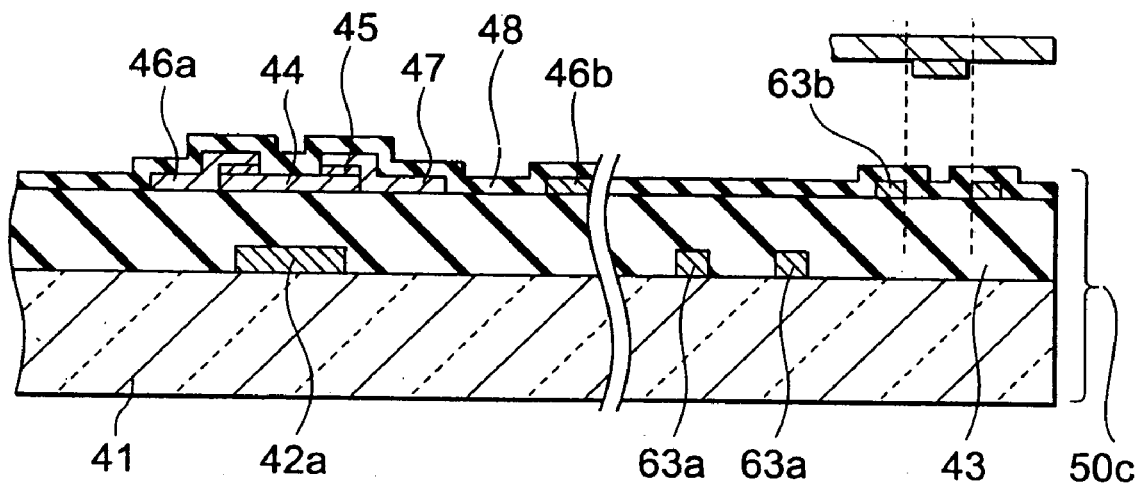
FIGS. 4A and 4B are sections subsequent to FIGS. 3A to 3C.
Figure 4B:
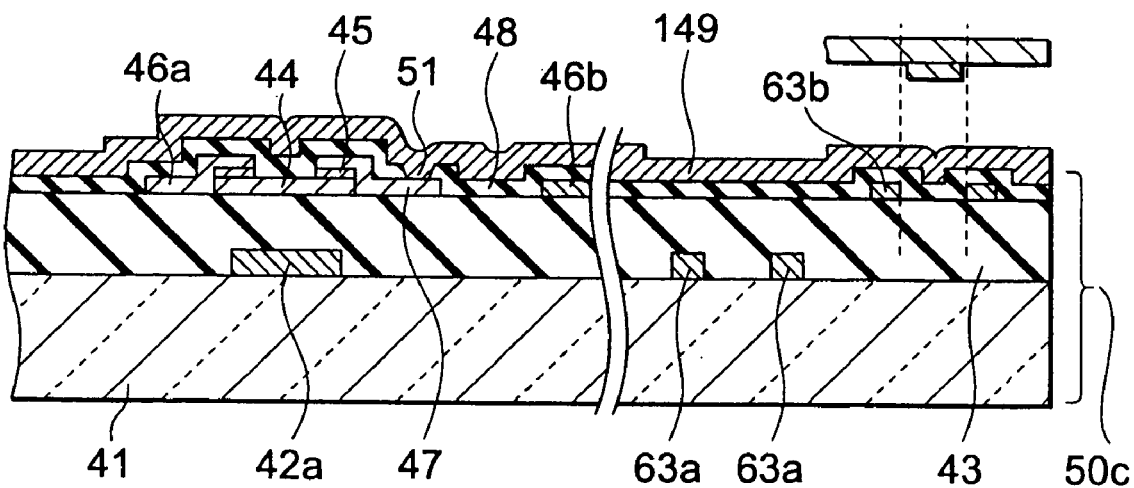
Figure 5A:
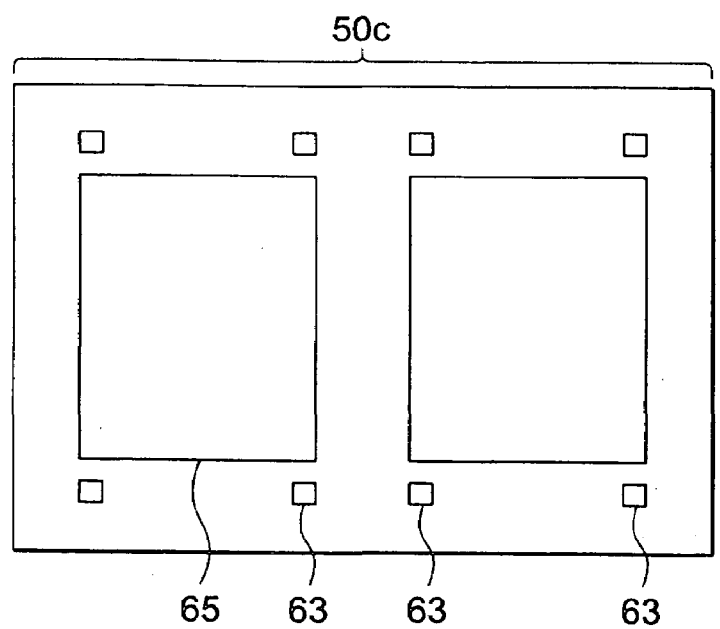
FIG. 5A is a plan view showing the positions of alignment marks of a first prior art of the active matrix wafer.
Figure 5B:
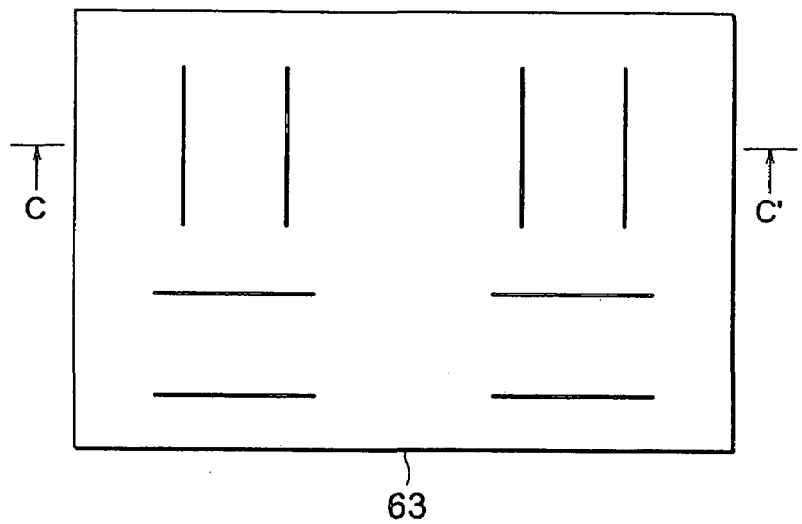
FIG. 5B is an enlarged plan view of the alignment marks.
Figure 5C:
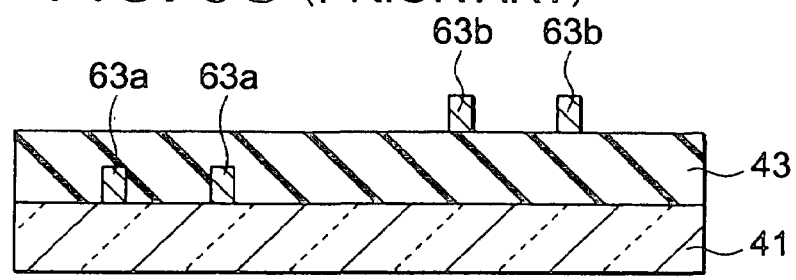
FIG. 5C is a section of the alignment marks.
Figure 6A:
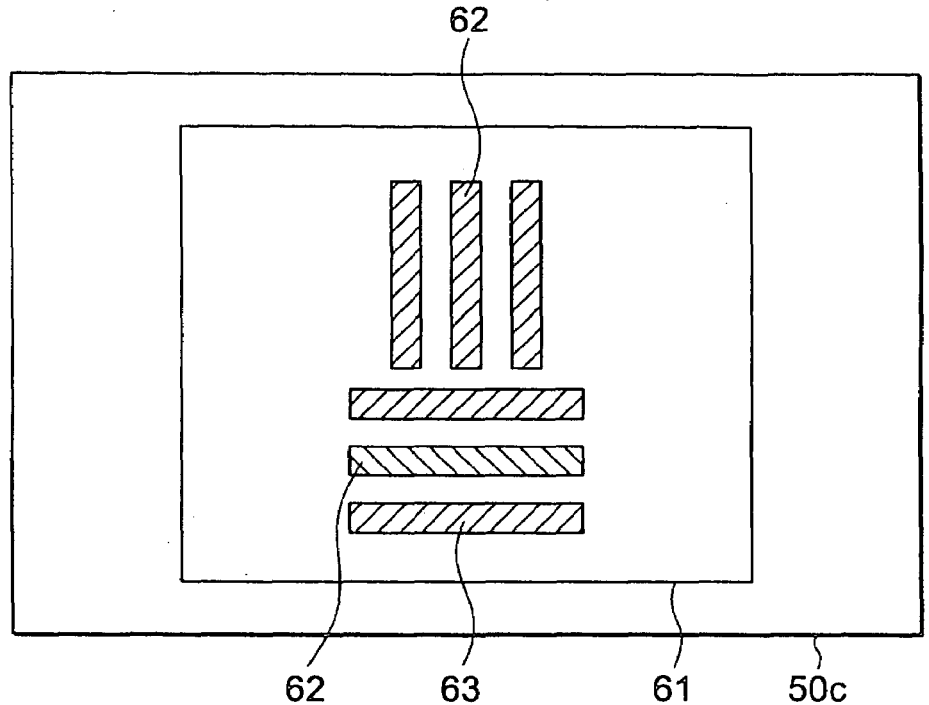
FIG. 6A is a plan view showing a principle of alignment by alignment marks according to a first prior art of an active matrix wafer and FIGS. 6B and 6c are sections thereof.
Figure 6B:
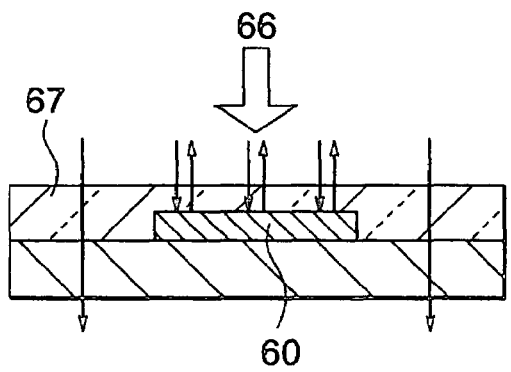
Figure 6C:
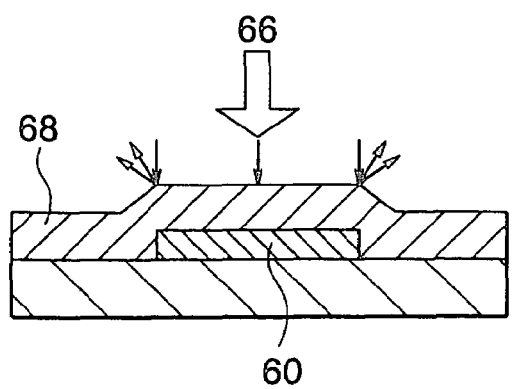
Figure 7A:
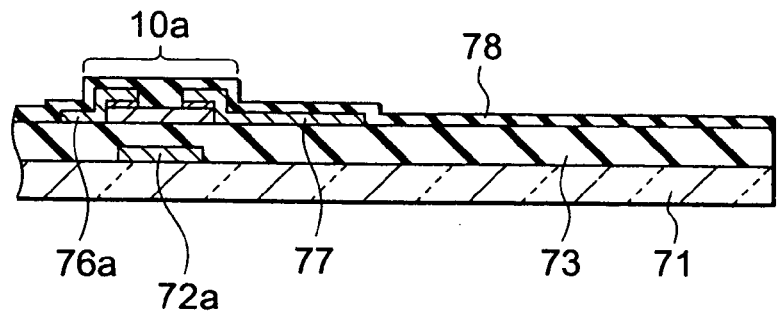
FIGS. 7A to 7C are sections showing the region of a TFT which show a manufacturing method of a second prior art of the active matrix wafer in the order of the manufacturing steps.
Figure 7B:
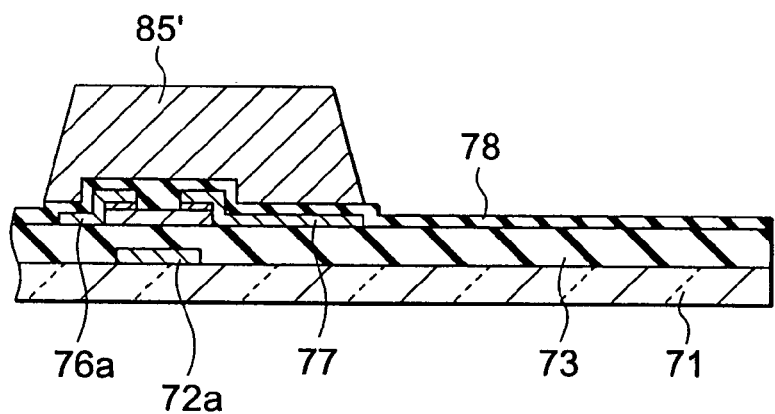
Figure 7C:
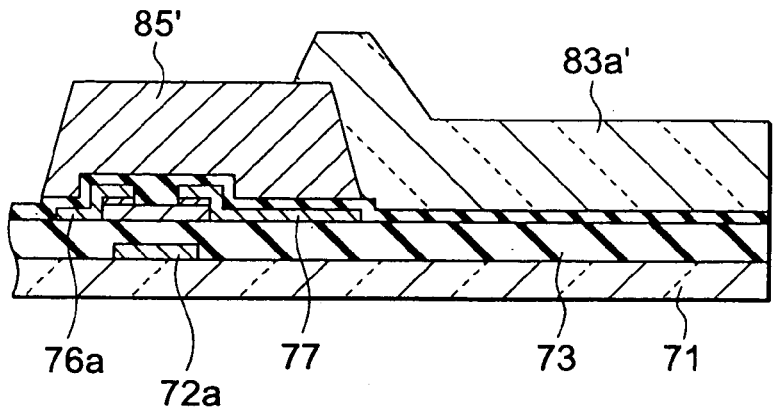
Figure 8A:
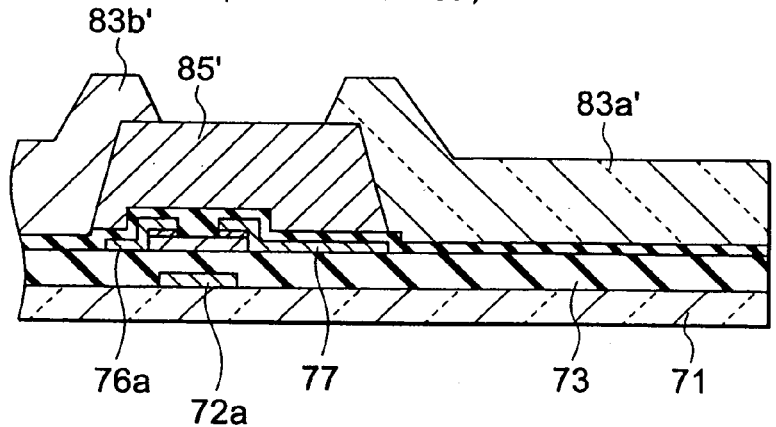
FIGS. 8A to 8C are sections subsequent to FIG. 7C.
Figure 8B:
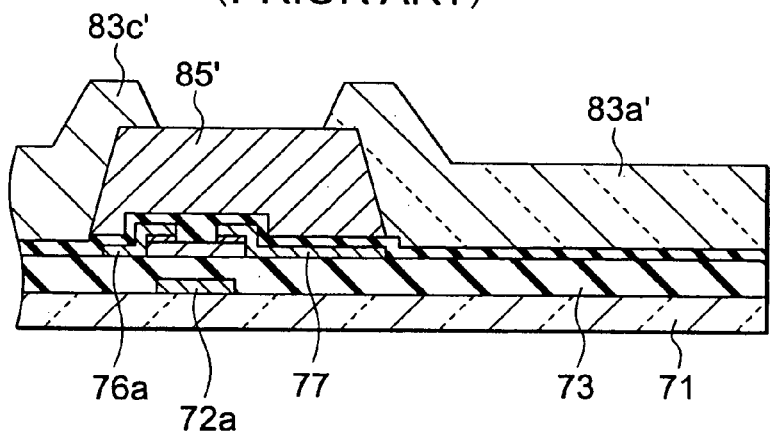
Figure 8C:
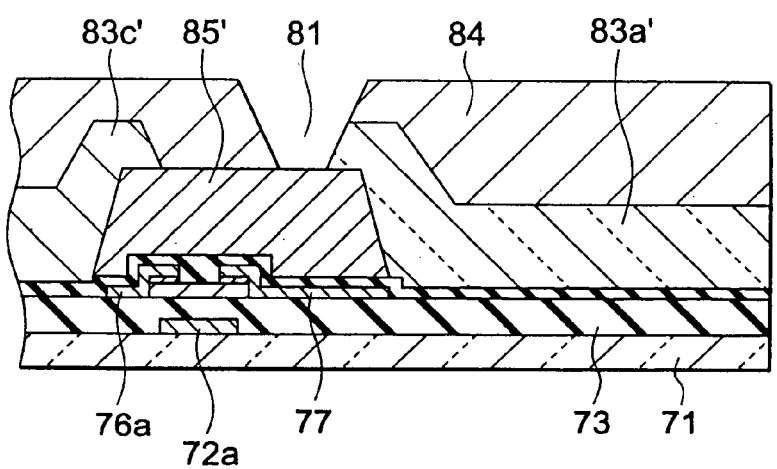
Figure 9A:
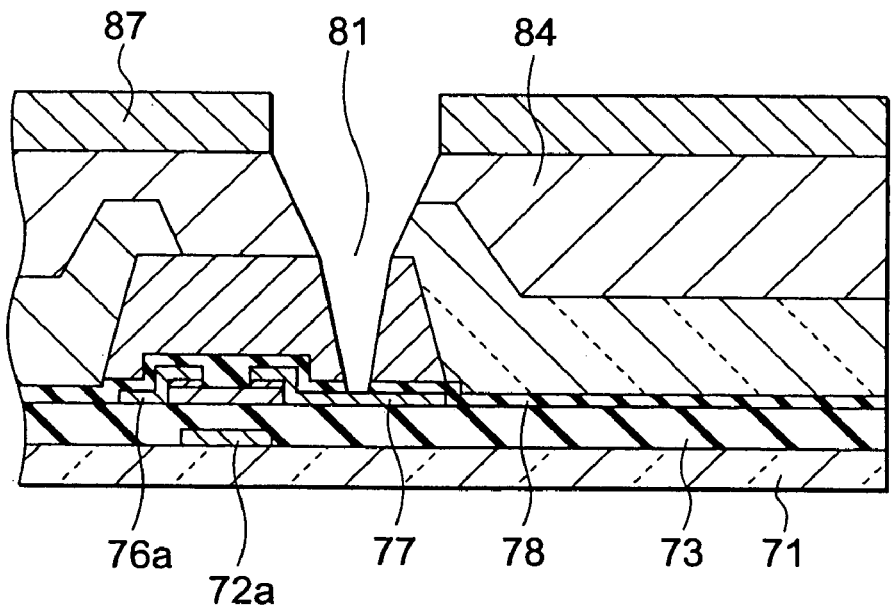
FIGS. 9A and 9B are sections subsequent to FIG. 8C.
Figure 9B:
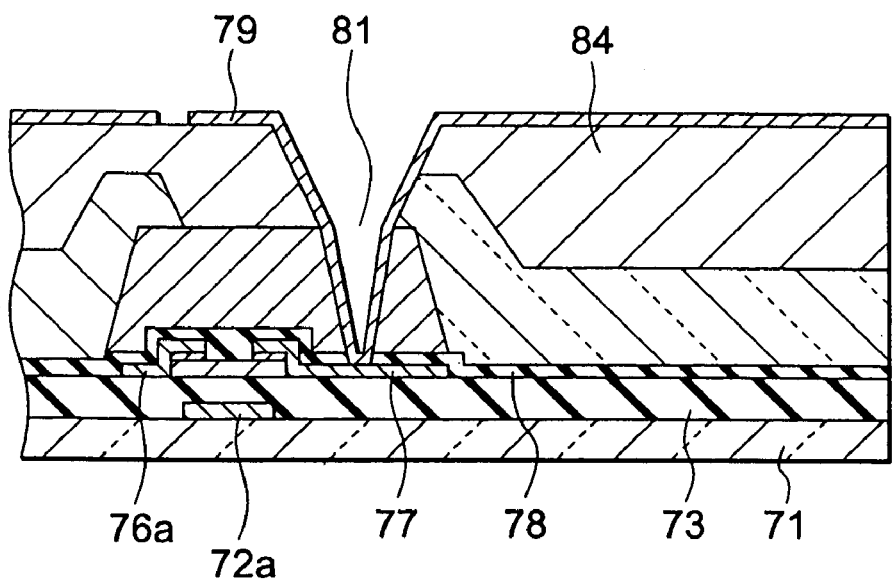
Figure 10A:
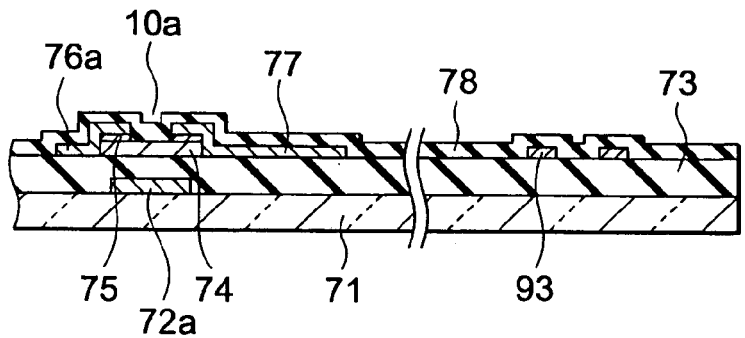
FIGS. 10A to 10C are sections showing the region of a TFT and alignment marks which show a manufacturing method of a second prior art of the active matrix wafer in the order of the manufacturing steps.
Figure 10B:
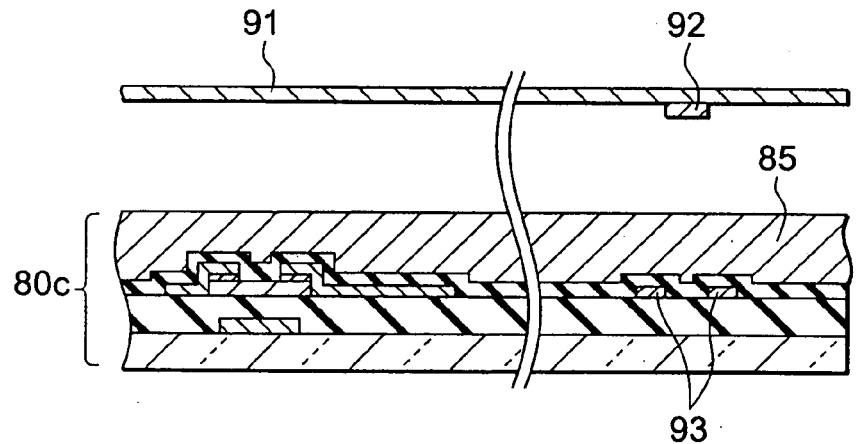
Figure 10C:
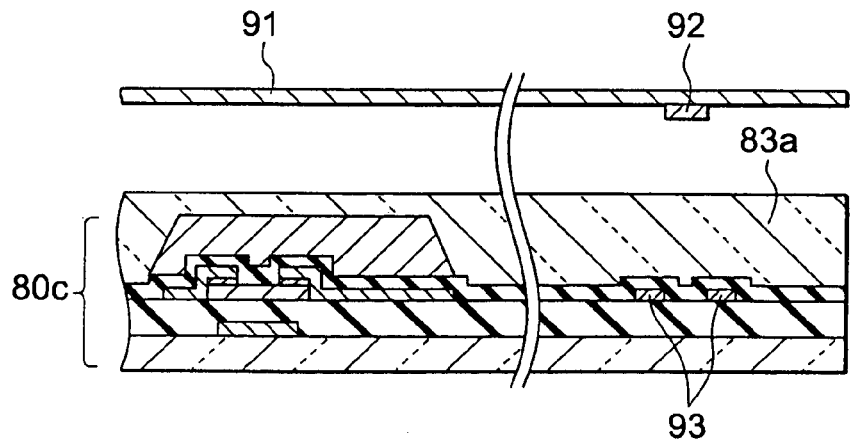
Figure 11A:
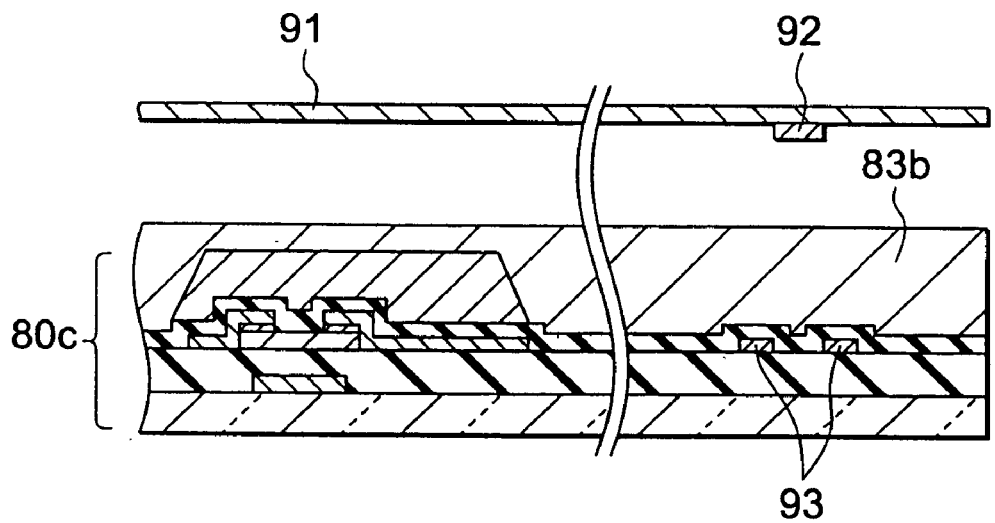
FIGS. 11A and 11B are sections subsequent to FIG. 10C.
Figure 11B:
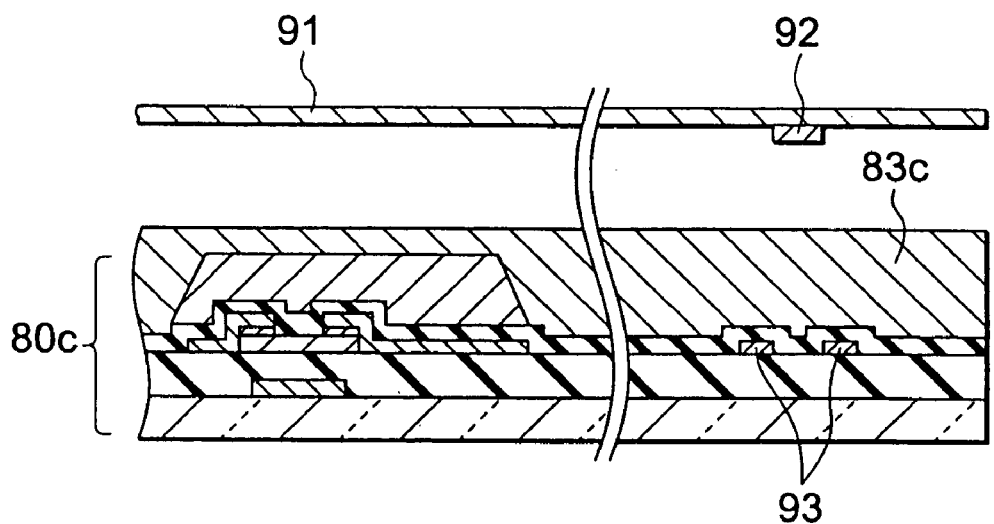
Figure 12A:
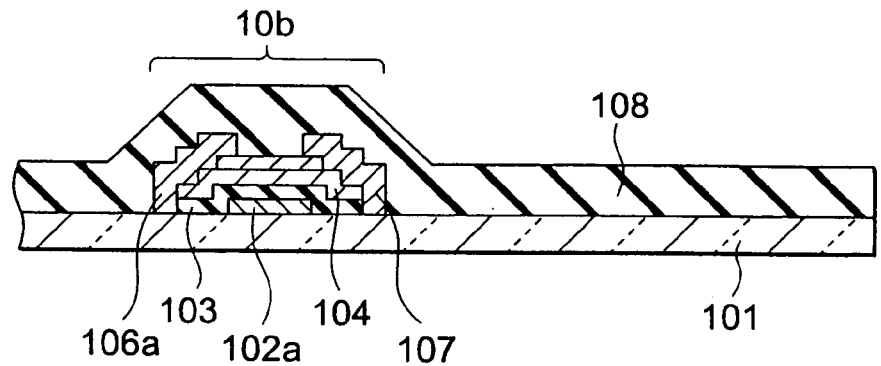
FIGS. 12A to 12C are sections showing the region of a TFT which show a manufacturing method of a third prior art of the active matrix wafer in the order of the manufacturing steps.
Figure 12B:
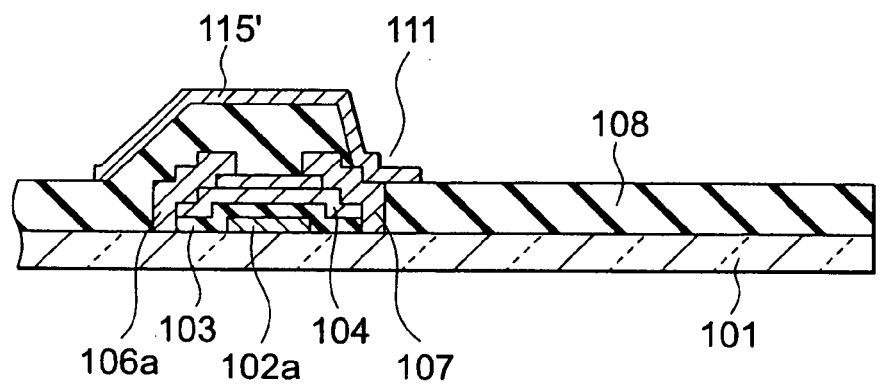
Figure 12C:
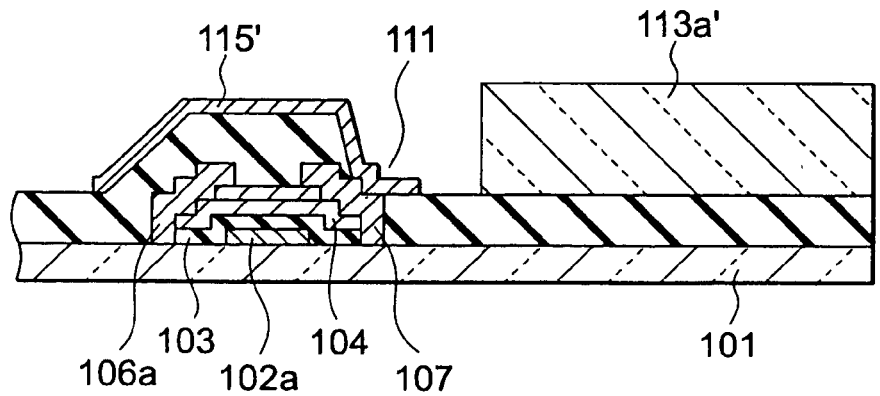
Figure 13A:
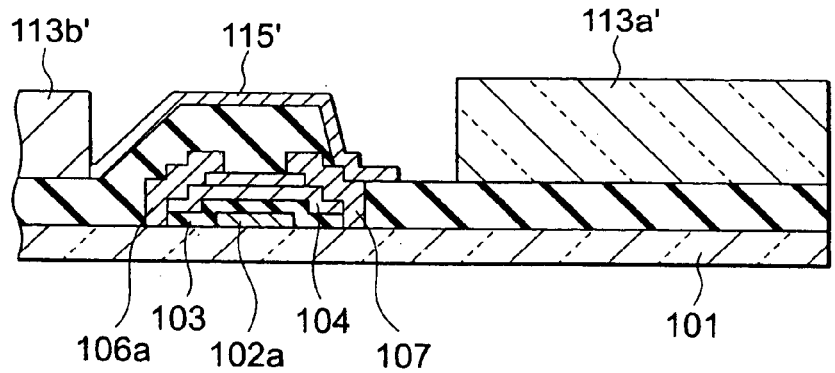
FIGS. 13A to 13C are sections subsequent to FIG. 12C.
Figure 13B:
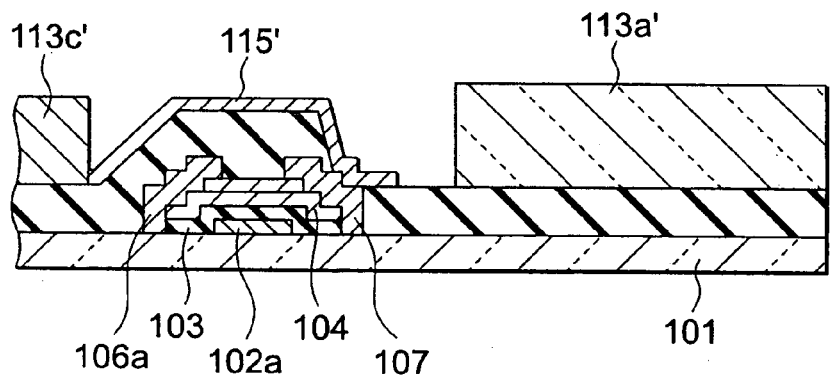
Figure 13C:
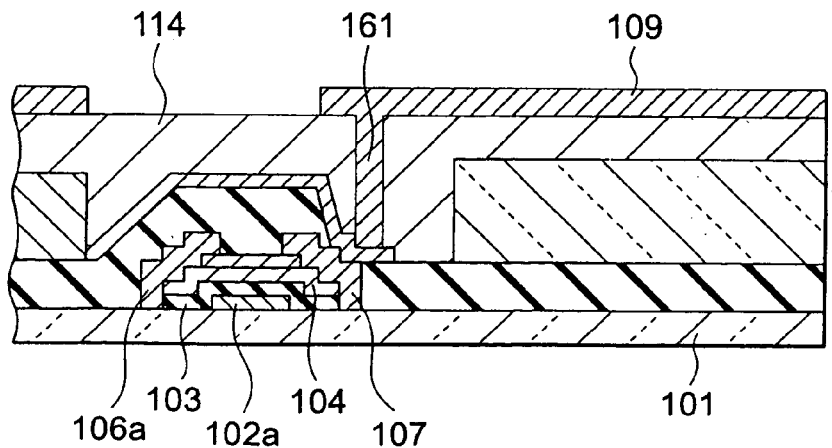
Figure 14A:
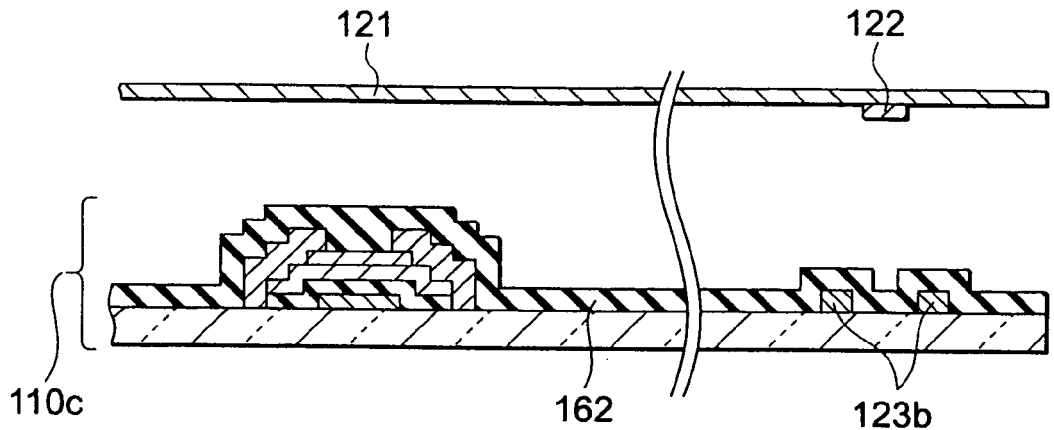
FIGS. 14A to 14C are sections showing the region of a TFT and alignment marks which show a manufacturing method of a third prior art of the active matrix wafer in the order of the manufacturing steps.
Figure 14B:
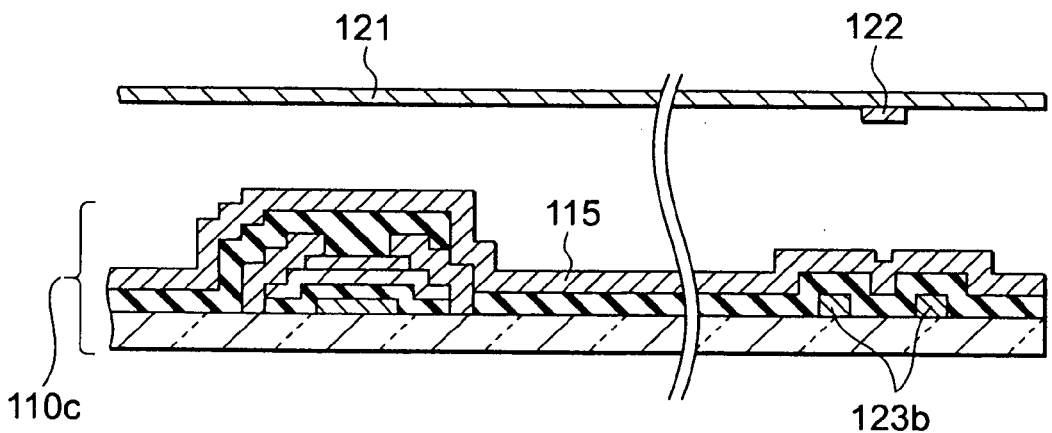
Figure 14C:
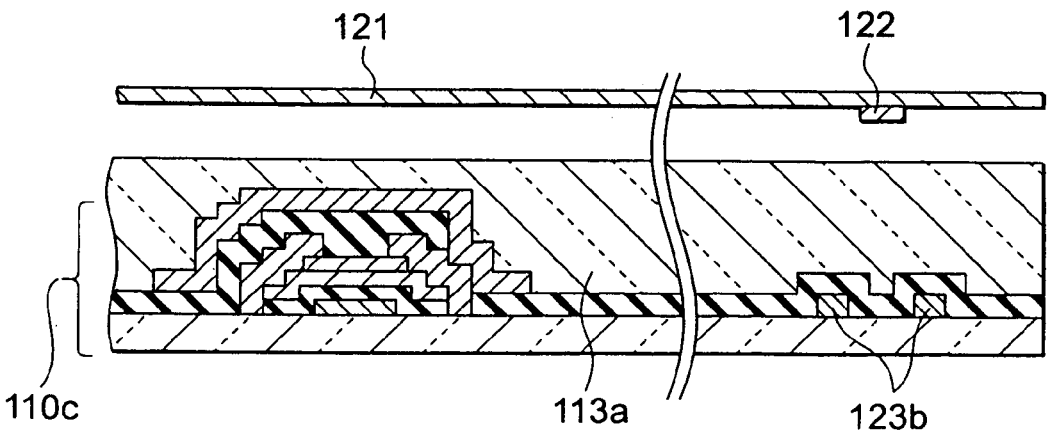
Figure 15A:
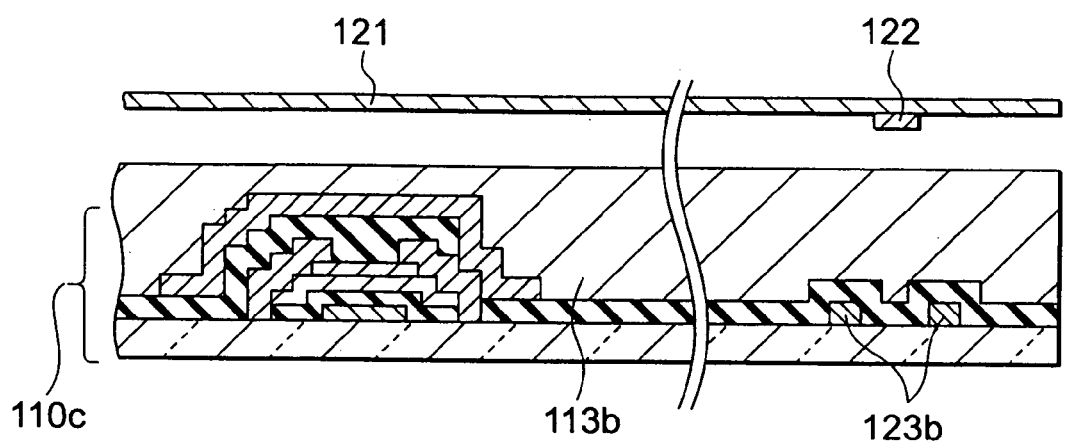
FIGS. 15A and 15B are sections subsequent to FIG. 14C.
Figure 15B:
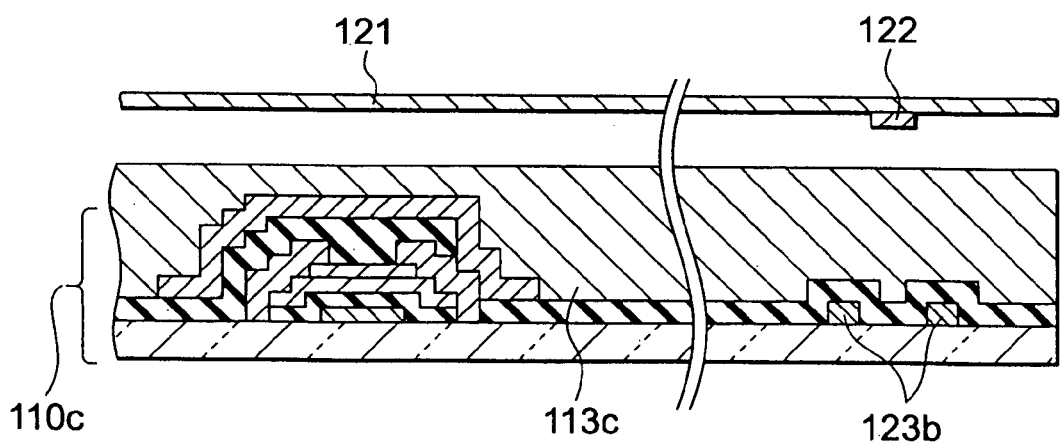
Figure 16A:
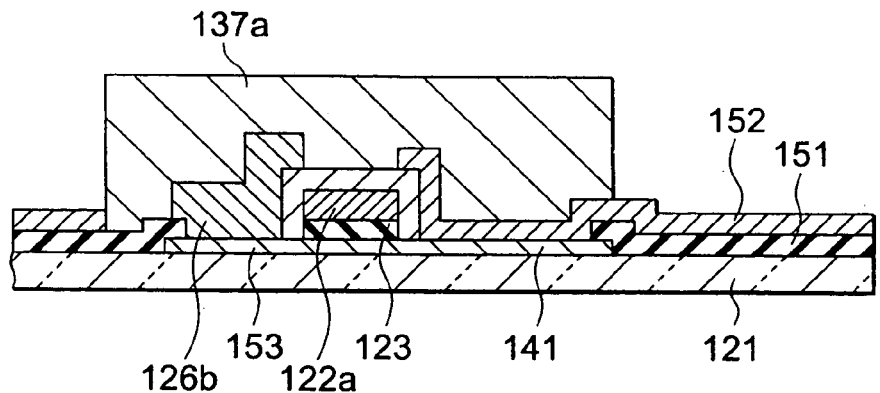
FIGS. 16A to 16C are sections showing the region of a TFT which show a manufacturing method of a fourth prior art of the active matrix wafer in the order of the manufacturing steps.
Figure 16B:
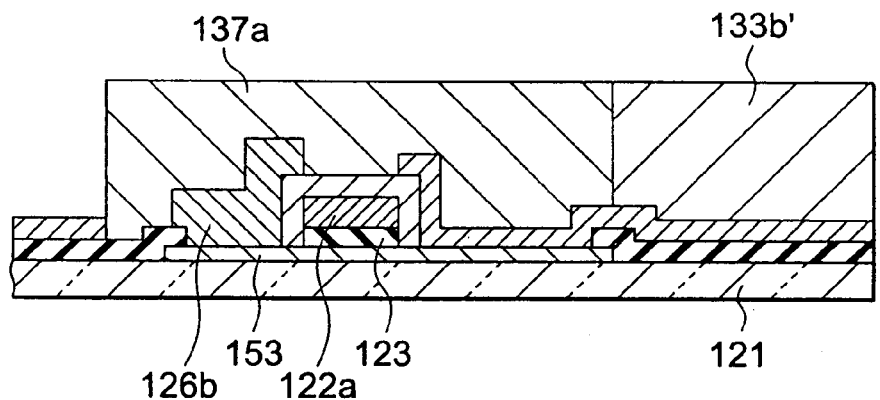
Figure 16C:
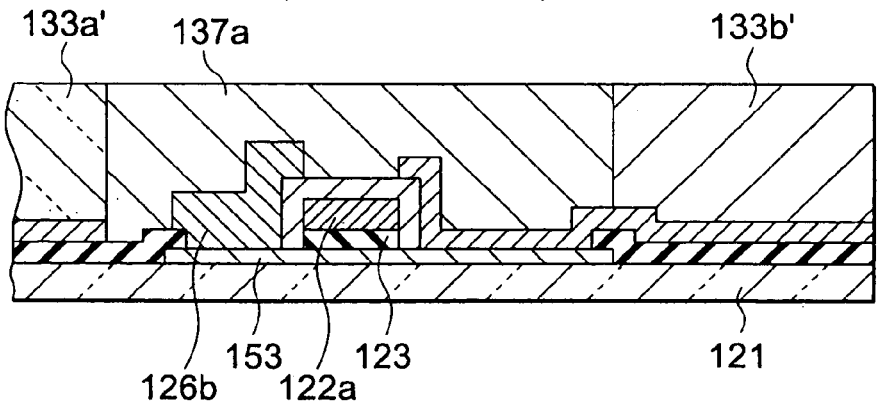
Figure 17A:
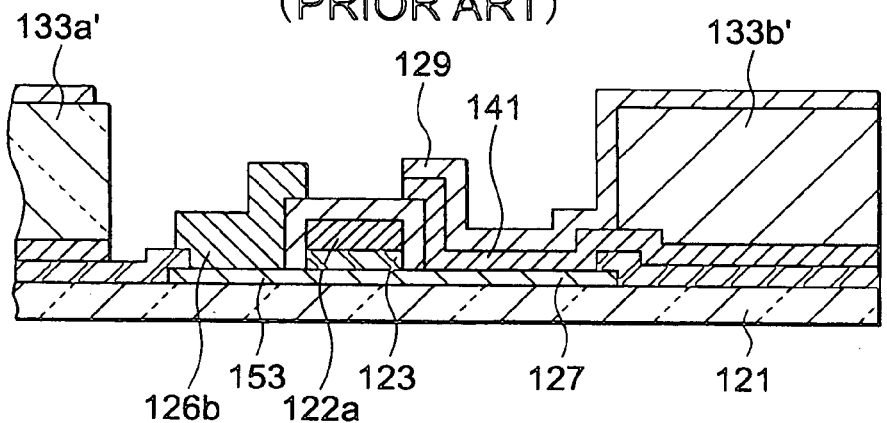
FIGS. 17A to 17C are sections subsequent to FIG. 16C.
Figure 17B:
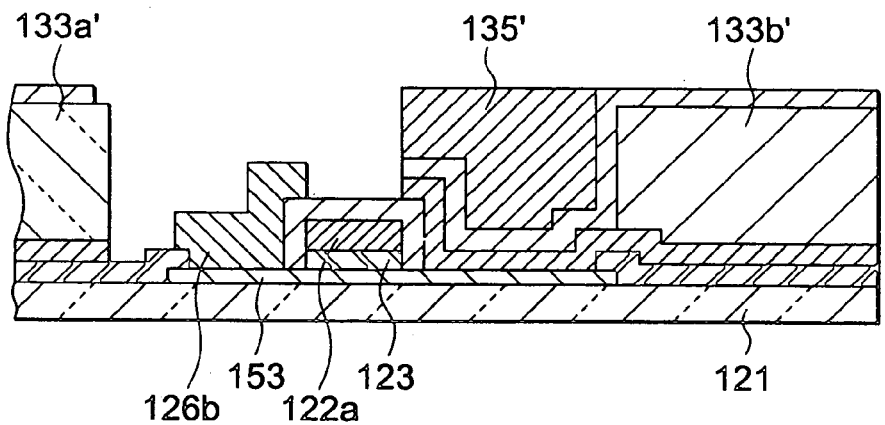
Figure 17C:
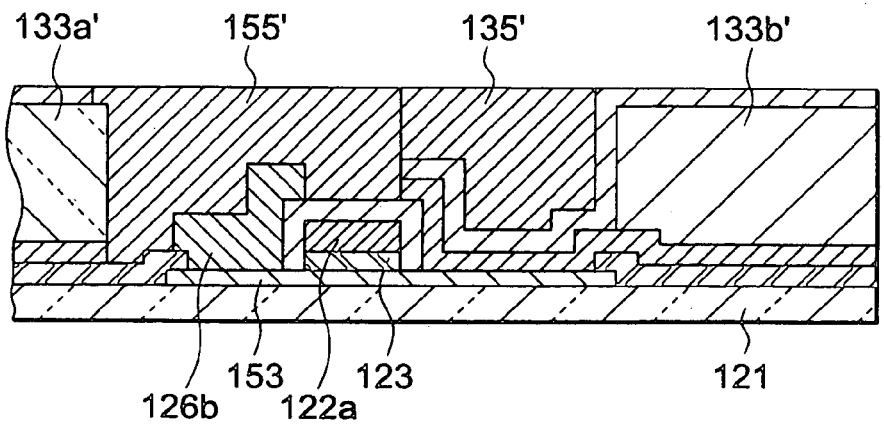
Figure 26A:
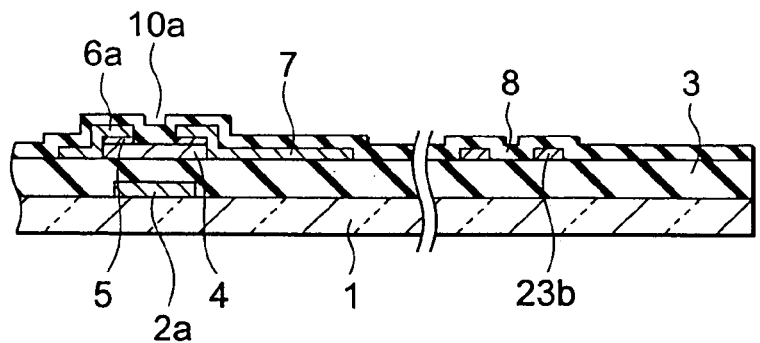
FIGS. 26A to 26C are sections showing a manufacturing method of a second embodiment of the invention in the order of the manufacturing steps.
Figure 26B:
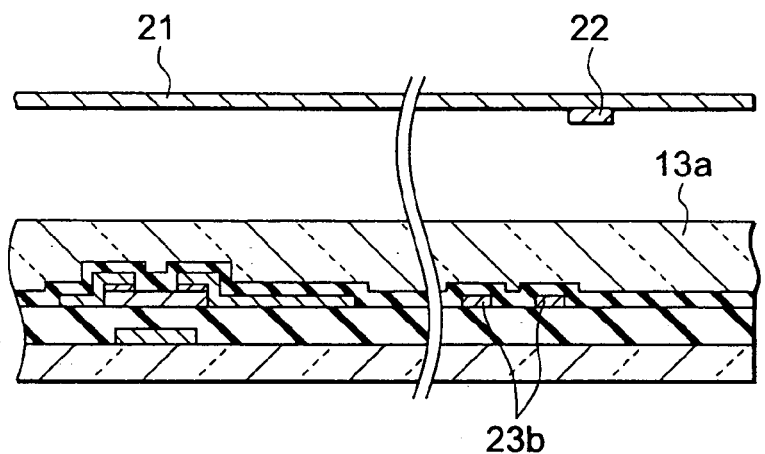

As regards FIG. 26A, since the composition is similar to that of the first embodiment, a description thereof is omitted. As shown in FIG. 26B, a negative photo-curing color resist, in which a red pigment is dispersed in an acrylic resin, is coated onto the wafer by spin coating. The spin speed is adjusted so that the film thickness becomes approximately 1.2 $\mu$M. Then, prebaking is performed at 80° C. for two minutes on a hot plate, and after exposure, development is performed with a TMAH (tetramethyl ammonium hydroxide) solution, and a red filter 13a is formed on a corresponding part. In the exposure step of the red filter 13a, since the red filter 13a layer allows an exposure alignment laser to permeate adequately, the drain layer alignment marks 23b underlying the red filter 13a layer is readily read. In the exposure step, a shown in FIG. 8, red filter layer alignment marks 24 are formed by the red filter layer. The red filter layer alignment marks 24 are each formed to be a line width of 10 $\mu$m and a film thickness of approximately 1.2 $\mu$m, which is the same as that of the red filter 13a.

Figure 26C:
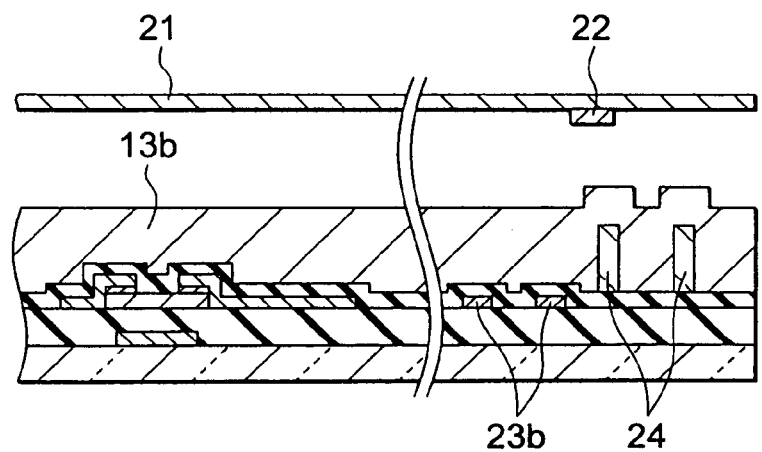

Then, a green filter 13b is formed in a similar manner to that for the red filter 13a formation, firing is performed at 220° C. for 60 minutes in an oven, and thus the green filter 13b is obtained. In the exposure step for this green filter, as shown in FIG. 26C, the green filter 13b covers the red filter layer alignment marks 24 formed on a passivation film 8, and the green filter 13b formed on the red filter layer alignment marks 24 having a height of approximately 1.2 $\mu$m cannot sufficiently flatten the unevenness of the red filter alignment mark. Therefore, in the exposure step of the green filter 13b, based on the step of the red filter layer alignment marks 24 formed of the red filter 13a layer, the alignment marks can be read.

Figure 27A:
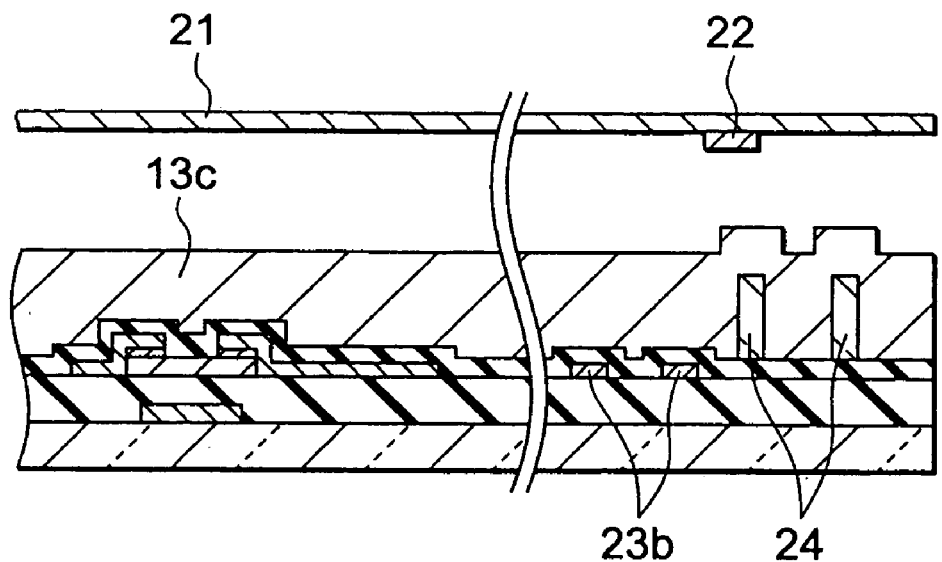
FIGS. 27A and 27B are sections subsequent to FIG. 26C.

Then a blue filter 13c is formed in a similar method to that for the green filter 13b and is fired at 220° C. for 60 minutes in an oven, thereby obtaining the blue filter 13c. In the exposure step of this blue filter 13c, as shown in FIG. 27A, alignment marks can be read by a method similar to that for the green filter 13b.

Figure 27B:
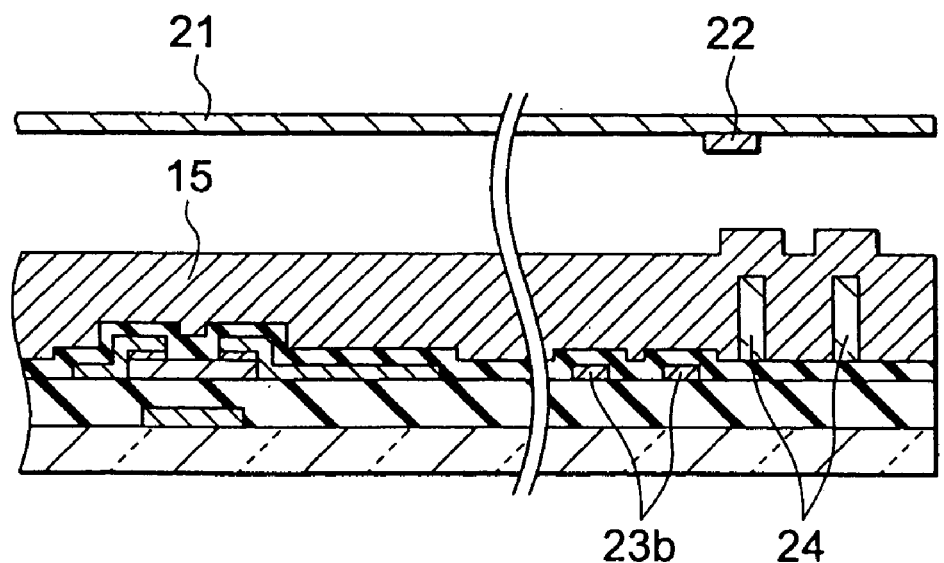

Then, as shown in FIG. 27B, a black matrix 15 can also be formed in a similar manner to that for the color layer.

Hereinafter, by a method similar to that of the first embodiment, a liquid crystal display having an active matrix wafer according to the second embodiment suggested by the present invention can be produced.

Figure 28:
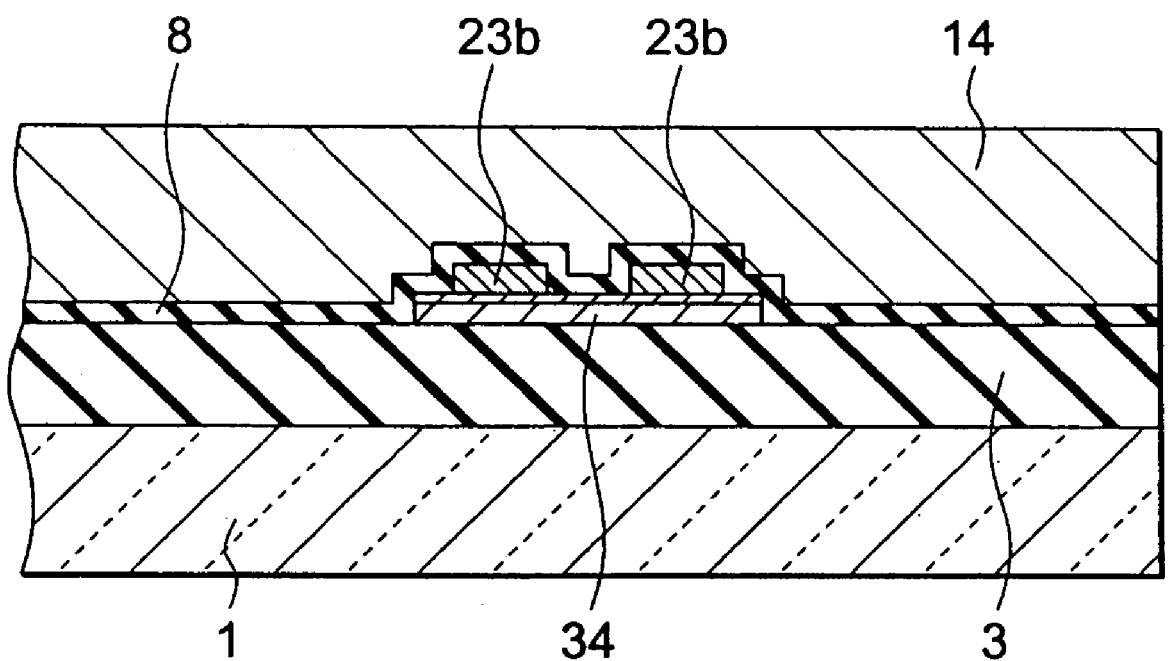
FIG. 28 is a section showing a third embodiment of the present invention.

Moreover, a third embodiment of the present invention is described with reference to FIG. 28 showing the section of the alignment mark portion of and FIGS. 29 showing production steps.

Figure 29A:
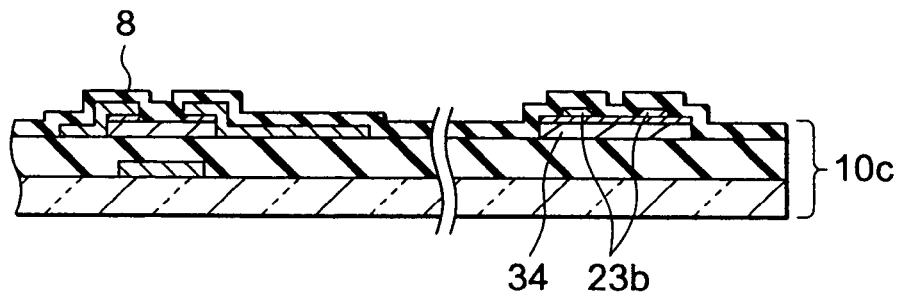
FIGS. 29A to 29C are sections showing a manufacturing method of a third embodiment of the invention in the order of the production steps.

As shown in FIG. 21A and FIG. 29A, a channel etch type TFT 10a is formed on the transparent insulated wafer 1 made of materials such as glass. Similarly to the prior art, the forming method can be performed in the following manner. On the transparent insulated wafer 1, a conductive layer made from Al, Mo, and Cr, etc. is deposited to be 100 to 400 nm in thickness by sputtering and by a photolithography step, gate wiring (not illustrated), gate electrodes 2a, and gate terminals (not illustrated) connected to an external signal processing wafer for display are formed.

Then, a gate insulating film 3 made of a silicon nitride film, a semiconductor layer 4 made of amorphous silicon, and ohmic contact layer 5 made of n+ amorphous silicon are laminated to be approximately 400 nm, 300 nm, and 50 nm in thickness in sequence in that order, respectively, and the semiconductor layer 4 and ohmic contact layer 5 are collectively patterned. Here, as shown in FIG. 28, a laminated layer pattern 34 comprising the semiconductor layer and ohmic contact layer is left as an isolated pattern on the area where drain layer alignment marks 23b are formed. The pattern may have a necessary minimum size so that the drain layer alignment marks 23b can be formed thereon.

Then, Mo and Cr, etc. are deposited to be 100 to 200 nm in thickness so as to cover the gate insulating film 3 and ohmic contact layer 5 by sputtering and thereon source electrodes 6a, source wiring 6b, drain electrodes 7, and data terminals 7a connected to an external signal processing wafer for display are formed by a photolithography step. Here, the drain layer alignment marks 23b are formed of the same metal layer on the isolated pattern formed of the laminated pattern of the semiconductor layer 4 and ohmic contact layer 5. Thereafter, the unnecessary ohmic contact layer 5 on the area other than under the source electrode 6a and drain electrode 7, which serves as a channel portion of the TFT, is removed.

Then, a passivation film 8 made of an inorganic film such as a silicon nitride film is formed to be 100 to 200 nm in thickness by the plasma CVD method so as to cover the back channel of the TFTs, that is, the source electrodes 6a, source wiring (not illustrated), the drain electrodes 7, and a data terminals 7a (not illustrated).

Figure 29B:
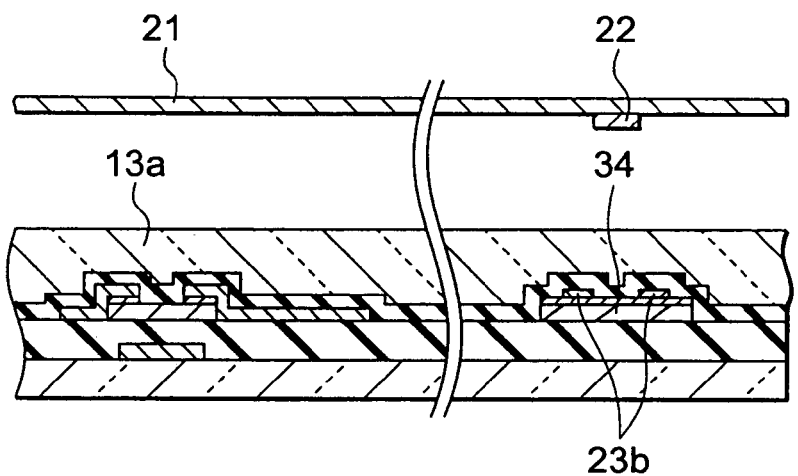

Then, as shown in FIG. 29B, a negative photo-curing color resist, in which a red pigment is dispersed in an acrylic resin, is coated on the wafer by spin coating. The spin speed is adjusted so that the film thickness becomes approximately 1.2 $\mu$m. Then, prebaking is performed at 80° C. for two minutes on a hot plate, after exposure, development is performed with a TMAH (tetramethyl ammonium hydroxide) solution, and a red filter 13a is formed on a corresponding part. In the exposure step of this red filter 13a, since the red filter 13a layer allows an exposure alignment laser to permeate adequately, the drain layer alignment marks 23*b* underlying the red filter 13*a* layer is readily read.

Figure 29C:
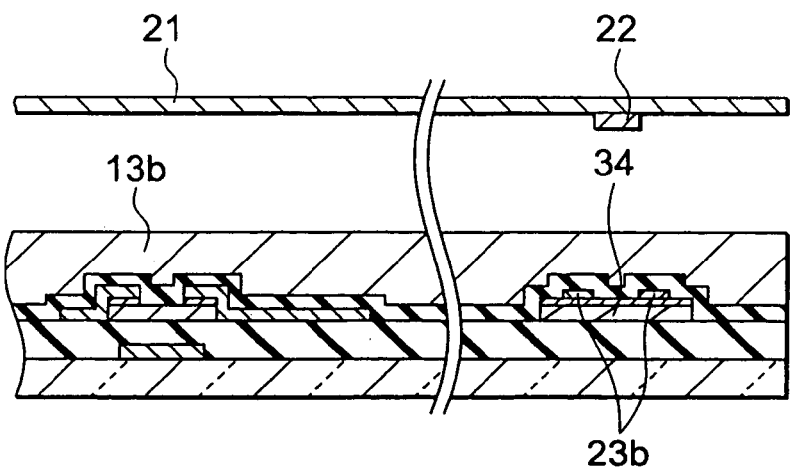

Then, a green filter 13*b* is formed in a similar manner to that for the red filter 13*a* formation, firing is performed at 220° C. for 60 minutes in an oven, and thus the green filter 13*b* is obtained. In the exposure step for this green filter, as shown in FIG. 29C, since the laminated isolated pattern of the semiconductor layer 4 and ohmic contact layer 5 has been formed under the drain layer alignment marks 23*b* under the passivation film 8, the step due to the drain layer alignment marks 23*b* including the laminated isolated pattern is 0.5 μm or more. Therefore, the overlying green filter 13*b* is formed to be thinner by the step thickness. As a result, an alignment laser is not completely absorbed by the green filter 13*b* and the reflected light from the alignment marks can be detected.

Figure 30A:
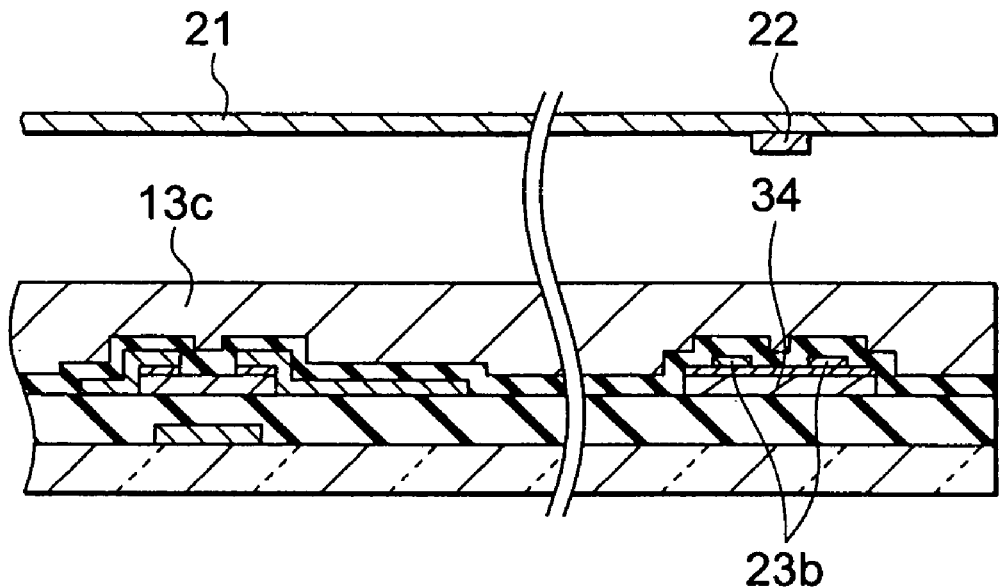
FIGS. 30A and 30B are sections subsequent to FIG. 29C.

Then a blue filter 13*c* is formed in a similar method to that for the green filter 13*b* and is fired at 220° C. for 60 minutes in an oven, thereby the blue filter 13*c* is obtained. In the exposure step of this blue filter 13*c*, as shown in FIG. 30A, alignment marks can be read in a similar method to that for the green filter 13*b*.

Figure 30B:
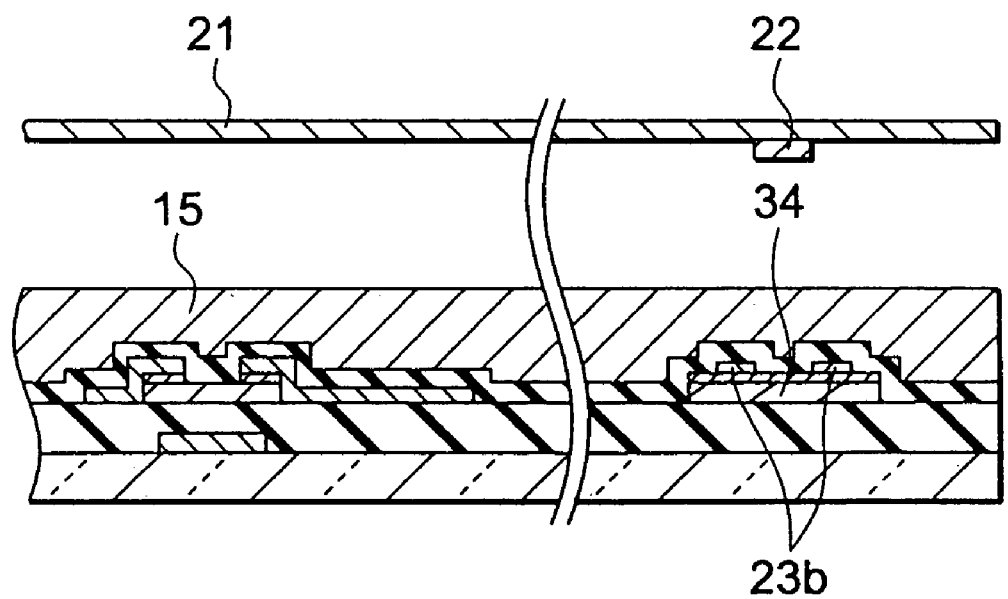

Then, as shown in FIG. 30B, a black matrix 15 can also be formed in a similar manner to that for the color layer.

Hereinafter, by a similar method to that in the first embodiment, a liquid crystal display having an active matrix wafer according to the third embodiment suggested by the present invention can be produced.

What is claimed is:

1. A manufacturing method for alignment marks comprising the steps of:
    forming a thin-film transistor including at least a gate electrode, a gate insulating film, a semiconductor thin film, source and drain electrodes on a wafer;
    forming alignment reference marks by using the same materials as those of at least one of the gate electrode, the semiconductor film, and the source and drain electrodes in an area other than a formation area for the thin-film transistor at the same time when the gate electrode, the semiconductor film and the source and drain electrodes are formed:
    forming red filter alignment reference marks comprising a red filter so as to cover the alignment reference marks; and
    then, performing alignment of the following step pattern based on the alignment reference marks below the red filter alignment marks.

2. The manufacturing method for alignment marks as set forth in claim 1, wherein:
    the alignment reference marks are formed at the same time as source and drain electrodes with a shading property are formed, and alignment is performed by means of light reflection caused by the alignment reference marks.

* * * * *